United States Patent [19]
Hasebe et al.

[11] Patent Number: 5,613,062
[45] Date of Patent: Mar. 18, 1997

[54] LOGIC SIMULATOR

[75] Inventors: Tetsuya Hasebe, Tokyo; Hiroaki Hayashi, Sagamihara; Kazuki Shinoda, Yokohama, all of Japan

[73] Assignee: Tokyo Electron Limited, Tokyo, Japan

[21] Appl. No.: 185,153

[22] Filed: Jan. 24, 1994

Related U.S. Application Data

[63] Continuation of Ser. No. 639,893, Jan. 11, 1991, abandoned.

[30] Foreign Application Priority Data

Jan. 12, 1990 [JP] Japan ............................ 2-4927
Jan. 12, 1990 [JP] Japan ............................ 2-4928

[51] Int. Cl.⁶ ...................................... G06F 17/50
[52] U.S. Cl. ........................ 395/183.13; 364/578
[58] Field of Search ..................... 371/23; 364/578; 395/500, 183.13

[56] References Cited

U.S. PATENT DOCUMENTS

| | | | |
|---|---|---|---|
| 4,306,286 | 12/1981 | Cocke et al. | 395/800 |
| 4,527,249 | 7/1985 | Van Brunt | 364/578 |
| 4,587,625 | 6/1986 | Marino, Jr. et al. | 364/578 |
| 4,656,580 | 4/1987 | Hitchcock, Sr. et al. | 395/500 |
| 4,769,817 | 9/1988 | Krohn et al. | 371/23 |
| 4,787,061 | 11/1988 | Nei et al. | 395/500 |
| 4,787,062 | 11/1988 | Nei et al. | 395/500 |
| 4,862,347 | 8/1989 | Rudy | 395/500 |
| 4,872,125 | 10/1989 | Catlin | 364/578 |
| 4,914,612 | 4/1990 | Beece et al. | 364/578 |
| 4,945,503 | 7/1990 | Takasaki | 364/578 |
| 5,081,601 | 1/1992 | Eirikasson | 364/578 |
| 5,091,872 | 2/1992 | Agrawal | 364/578 |
| 5,105,374 | 4/1992 | Yoshida | 364/578 |

OTHER PUBLICATIONS

Blank, T., "A Survey of Hardware Accelesators Used in Computer–Aided Design", *IEEE Design & Test*, Aug. 1984, pp. 21–39.

Ghosh, S., "Behavioral–Level Fault Simulation", *IEEE Design & Test*, Jun. 1988, pp. 31–42.

Agawal, P. et al., "MARS:A Multiprocessor–Based Programmable Accelerator", *IEEE Design & Test*, Oct. 1987, pp. 28–36.

Primary Examiner—Stephen M. Baker
Attorney, Agent, or Firm—Oblon, Spivak, McClelland, Maier & Neustadt, P.C.

[57] ABSTRACT

A logic simulator includes a time wheel section for causing an external memory to store logic circuit data including data concerning an arrangement of a to-be-simulated logic circuit and data concerning an input signal to be input to the logic circuit and for performing time management of simulation, an accumulator section for executing simulation concerning the arrangement of the to-be-simulated logic circuit in accordance with the logic circuit data read out from the external memory, and a function logic section for executing simulation concerning an operation of the to-be-simulated logic circuit in response to the simulation result obtained by the accumulator section.

7 Claims, 18 Drawing Sheets

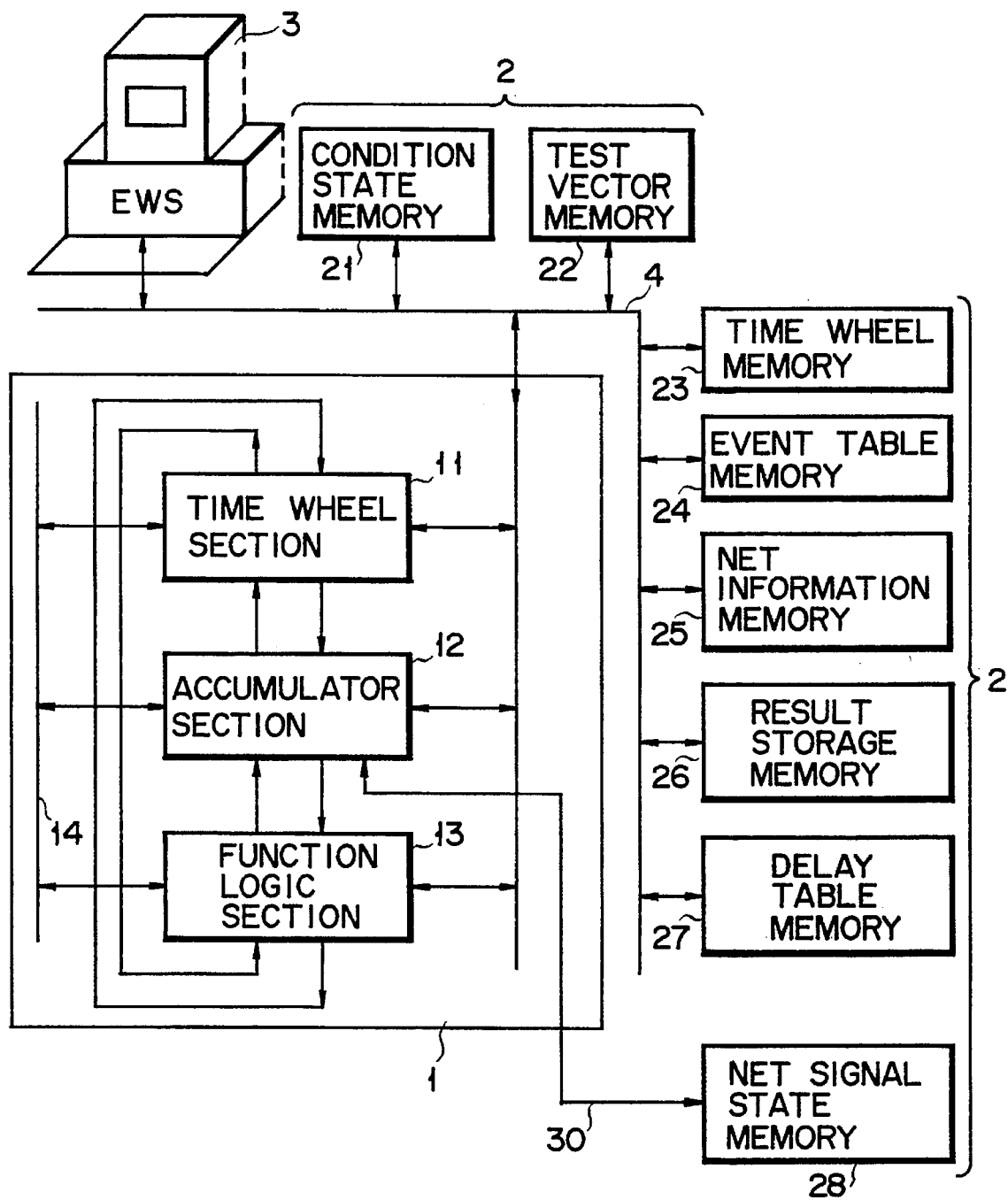
F I G. 1

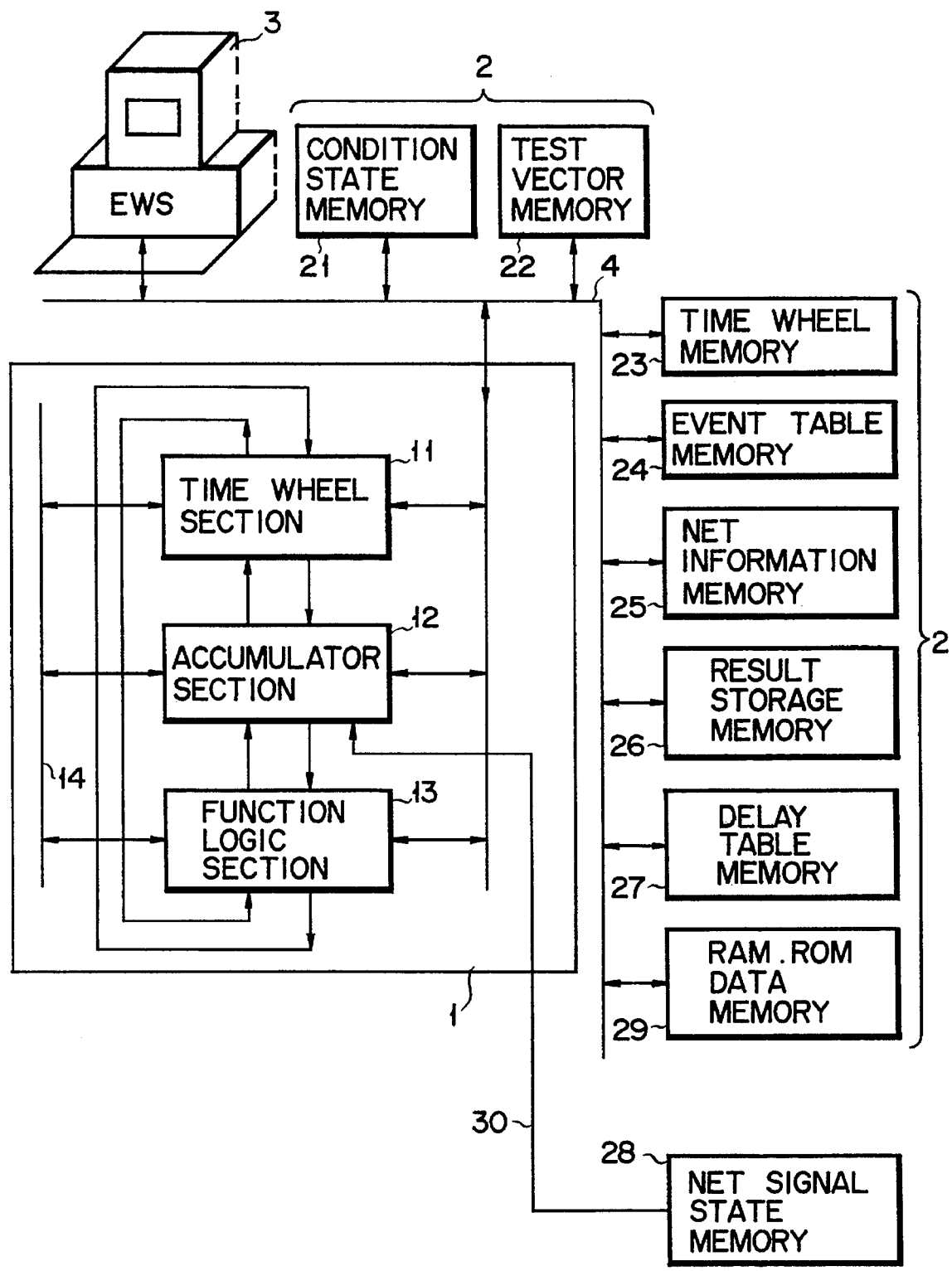
F I G. 7

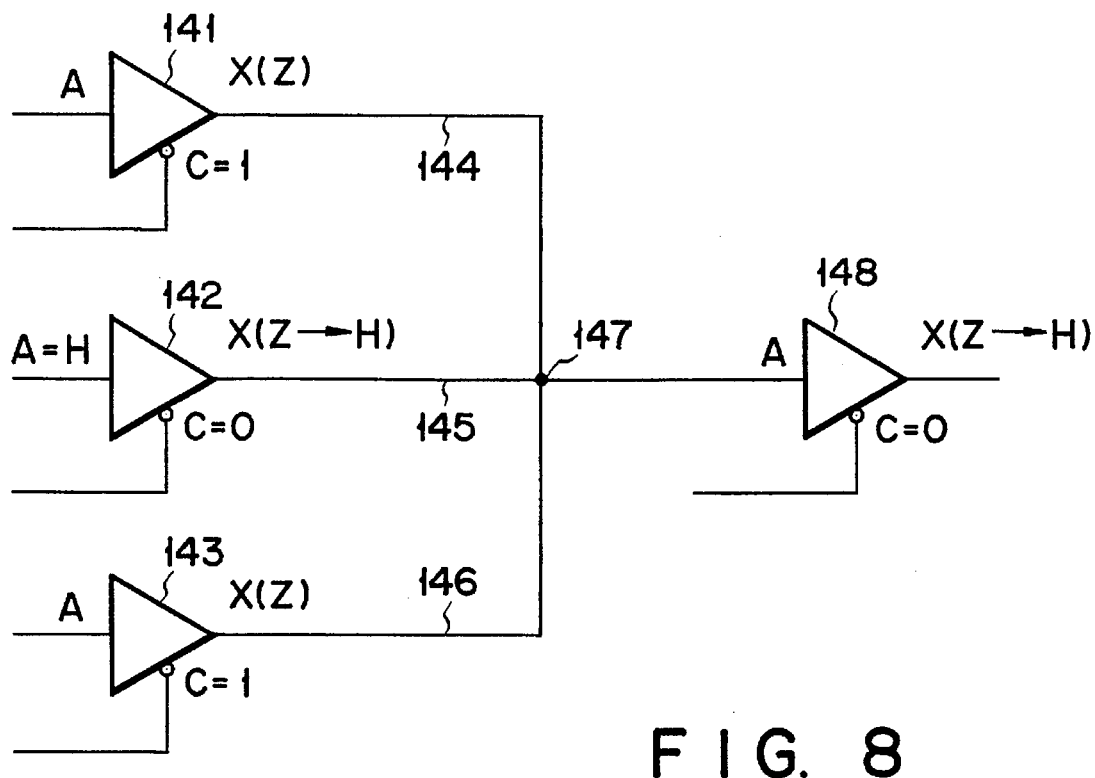
F I G. 8
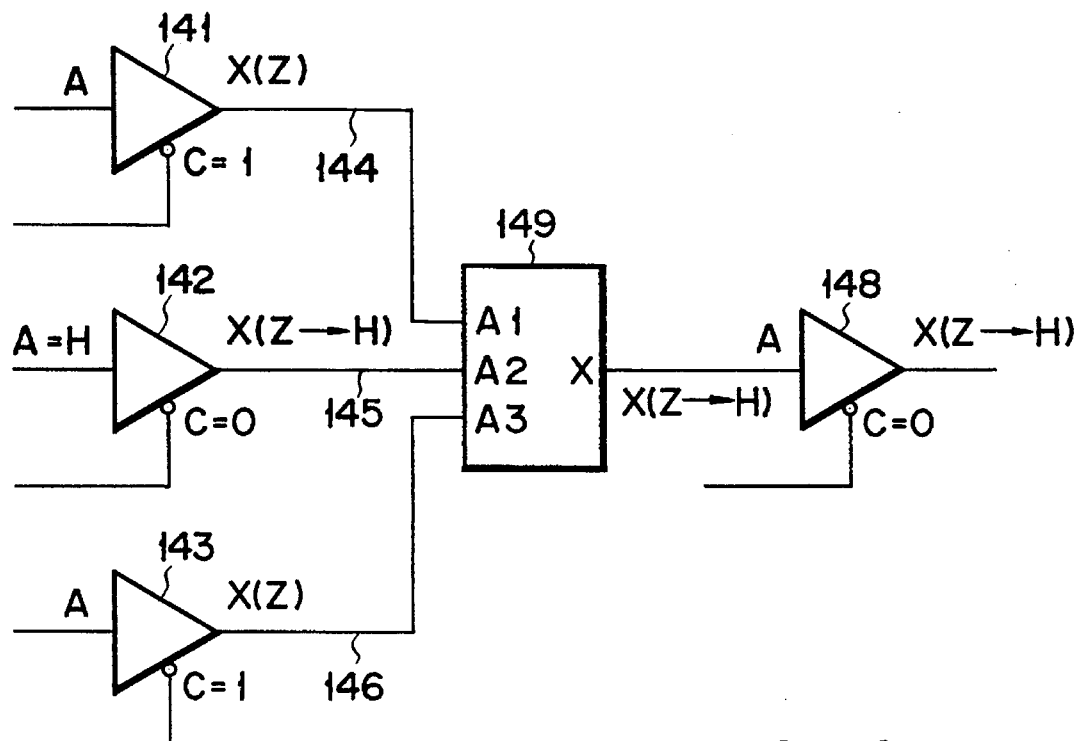
F I G. 9

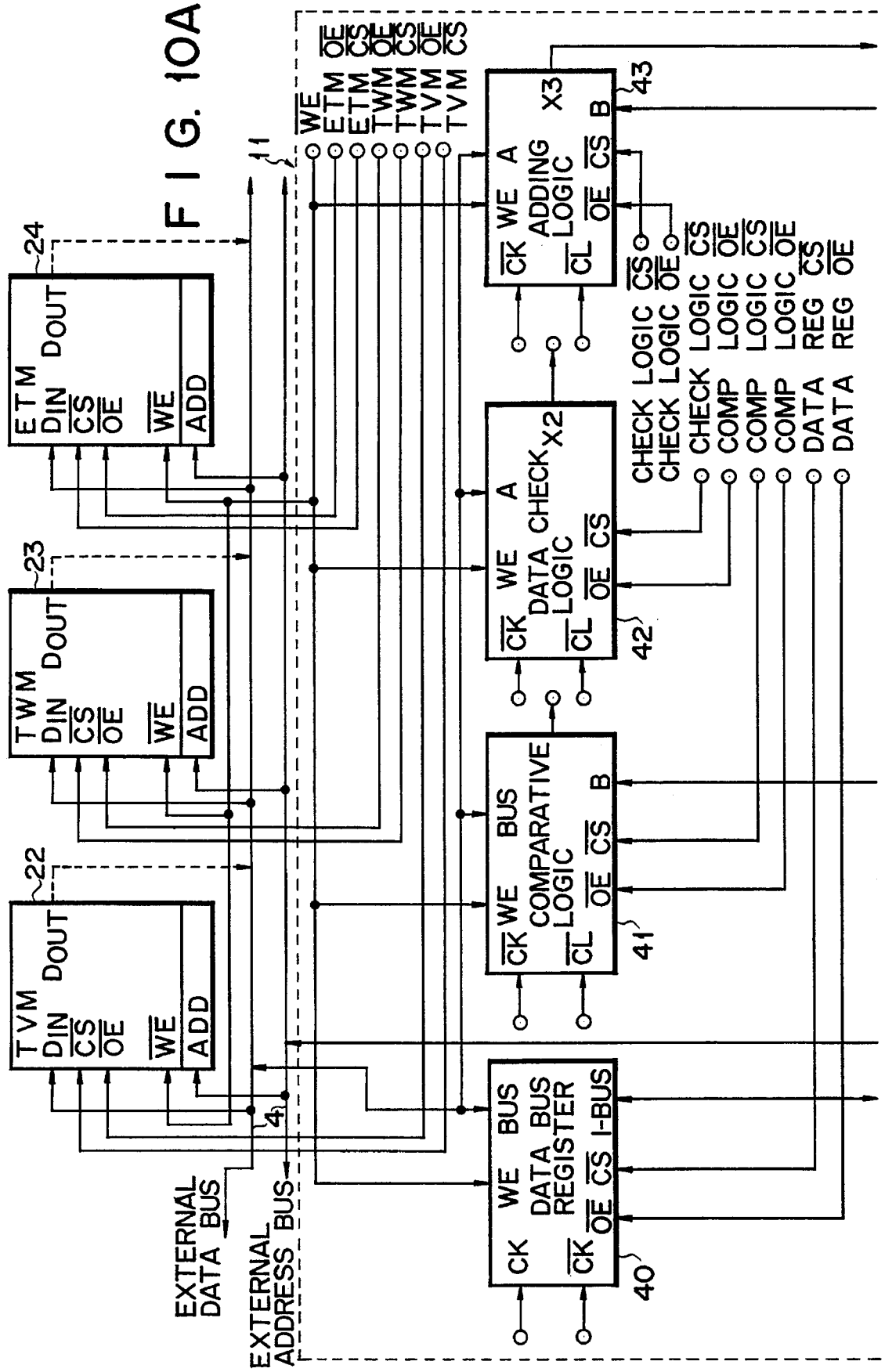

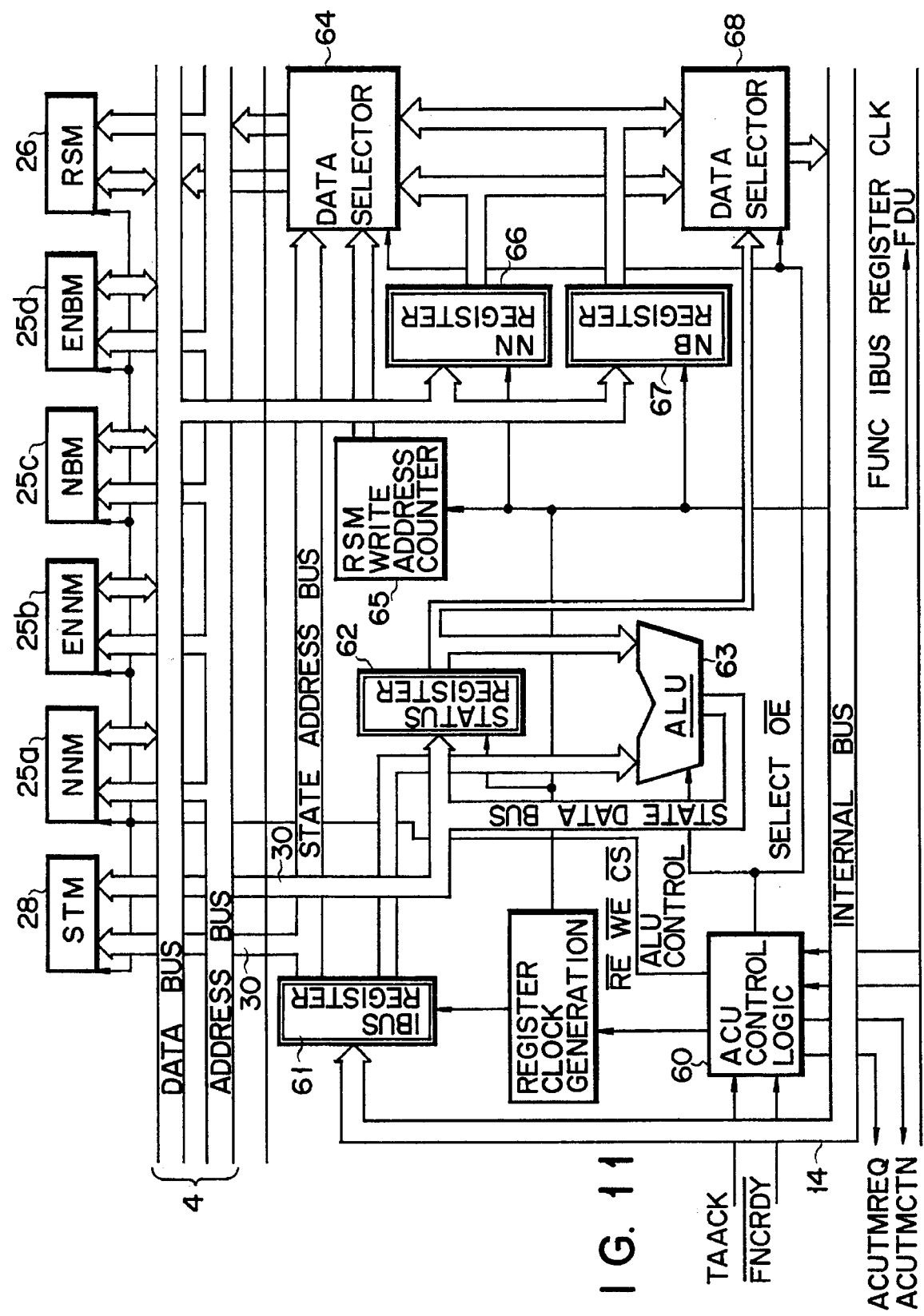
F I G. 11

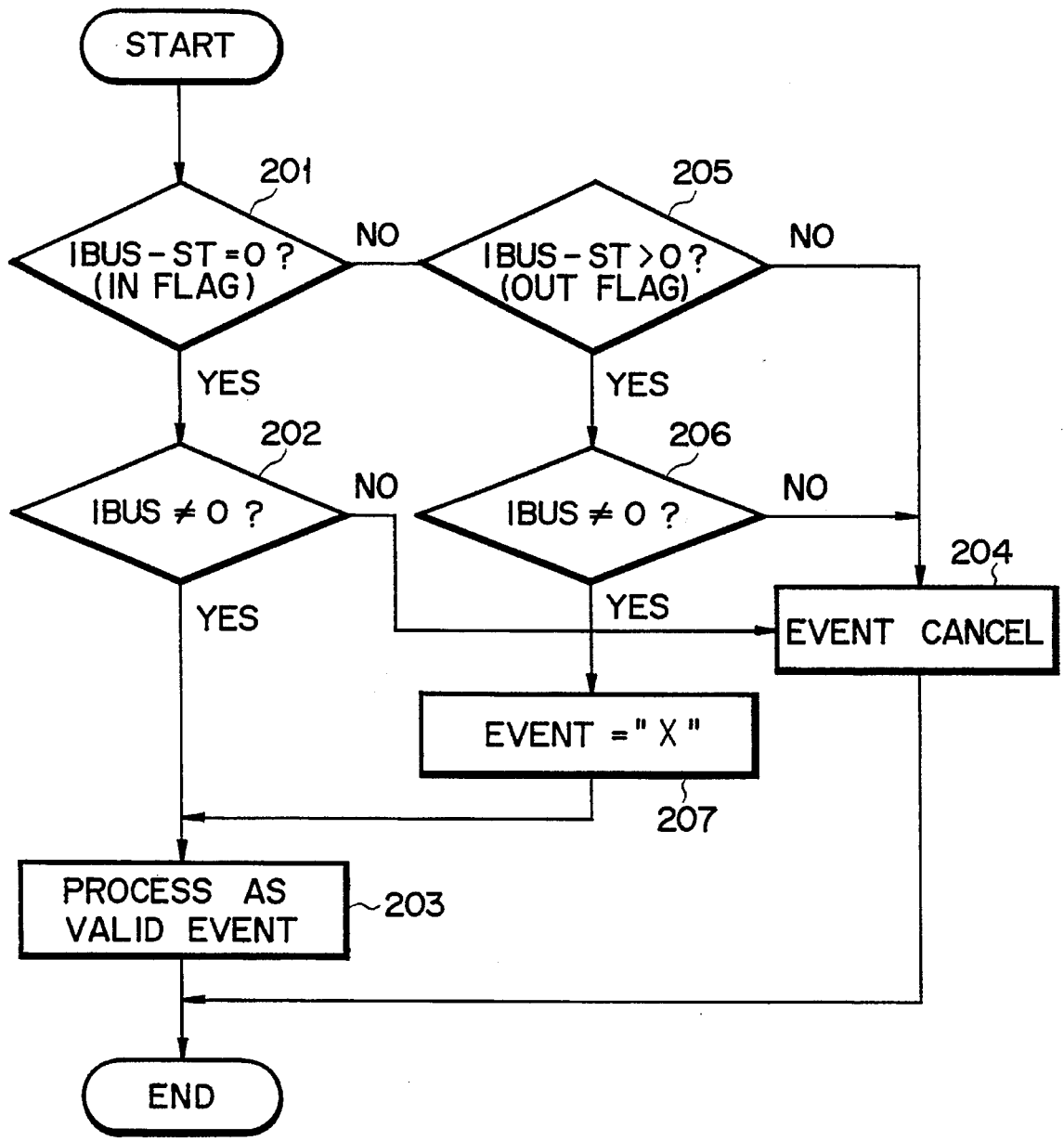
F I G. 12

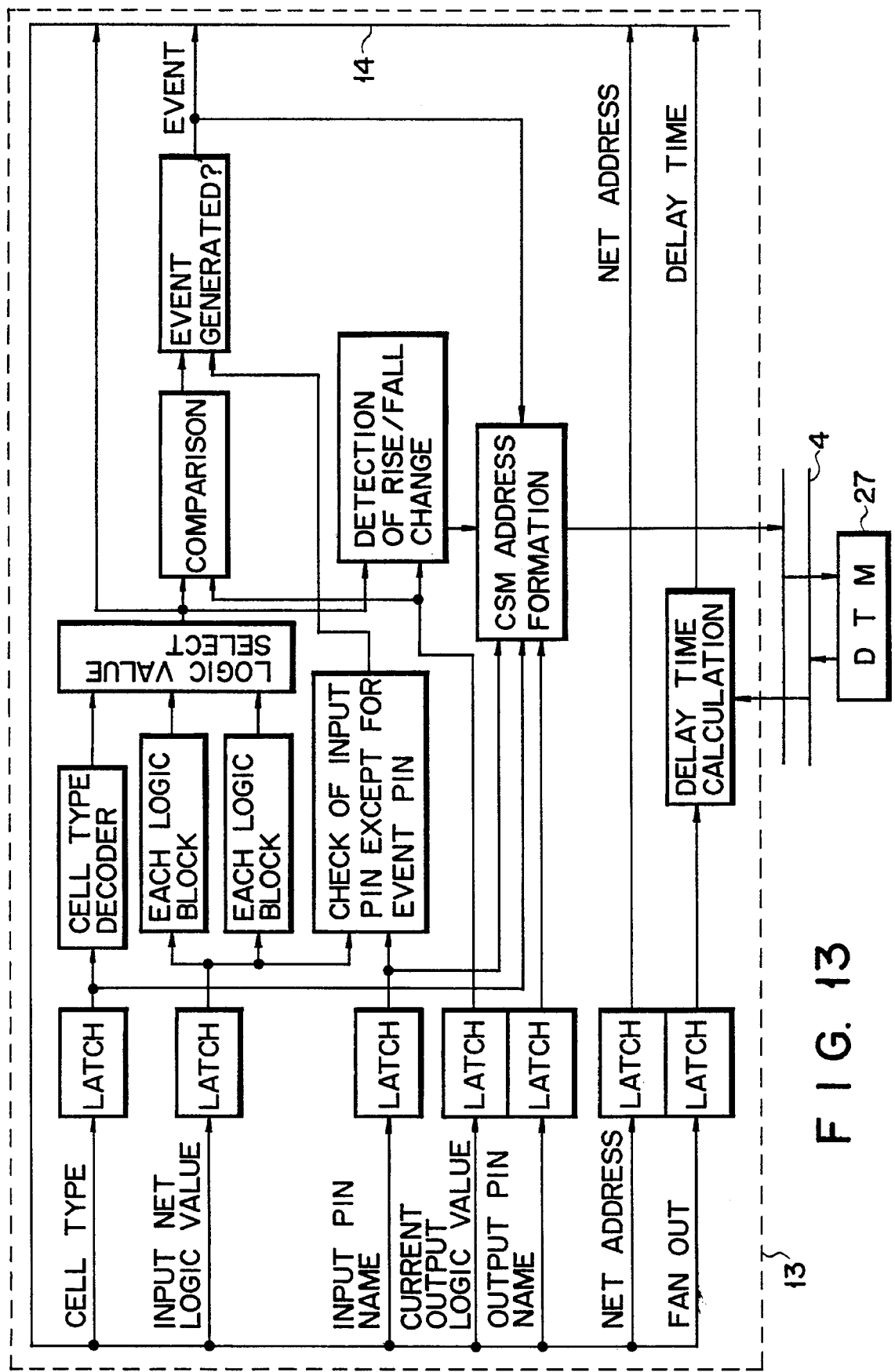
F I G. 13

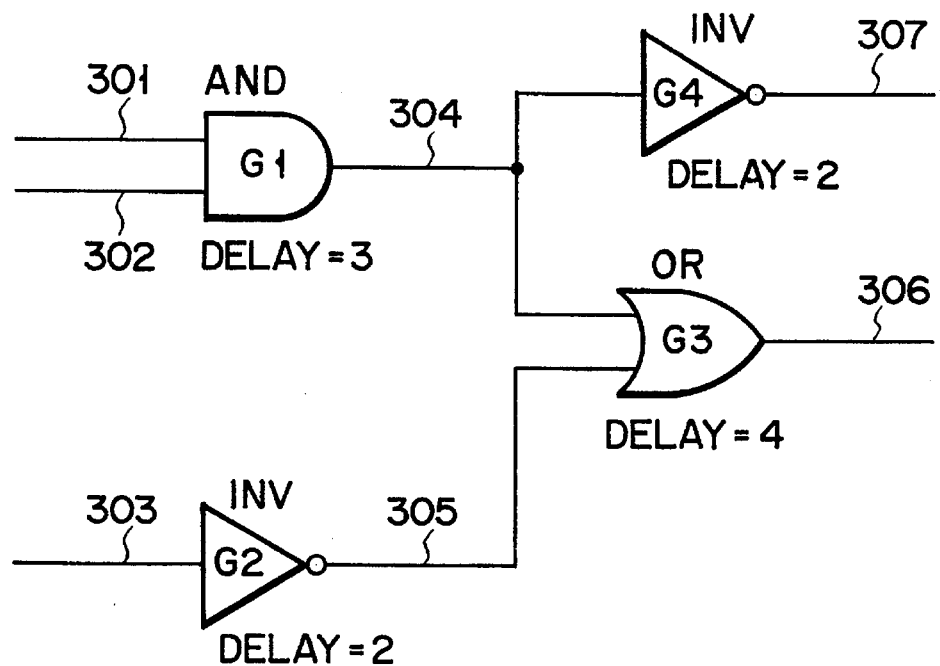
F I G. 14
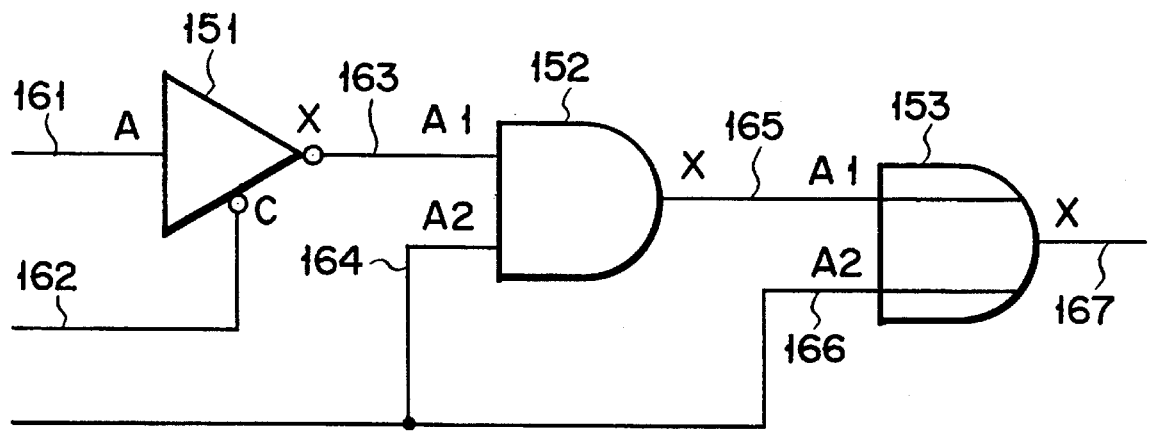
F I G. 21

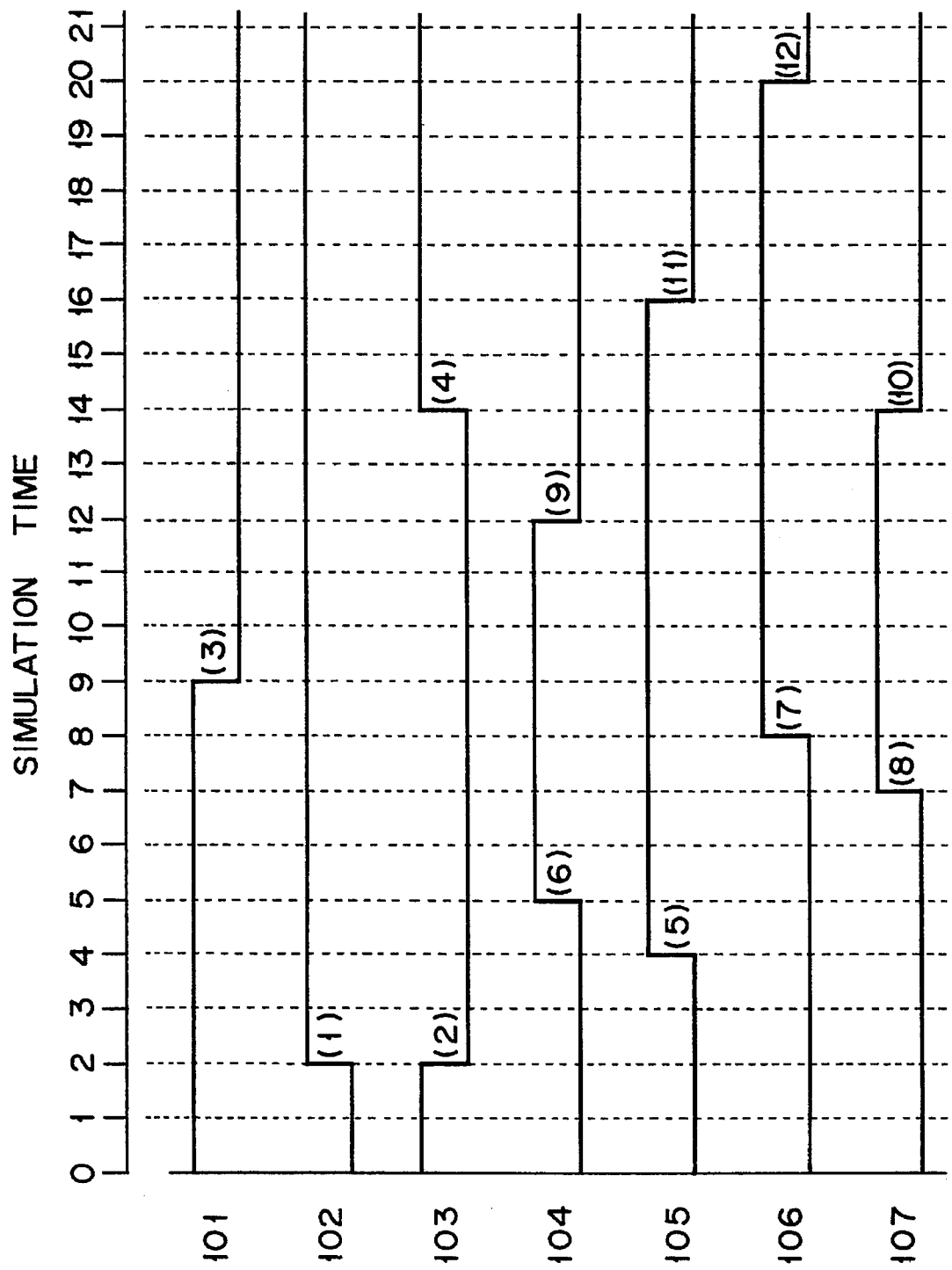
F I G. 15

NNM

| | | | |
|---|---|---|---|
| 301 | 304 | AND | END |
| 302 | 304 | AND | END |
| 303 | 305 | INV | END |
| 304 | 306 | OR | 0001 |
| 305 | 306 | OR | END |
| 306 | ...... | | END |

ENNM

| | | | |
|---|---|---|---|
| 0001 | 307 | INV | END |

FIG. 17

NBM

| | | |
|---|---|---|
| 301 | ...... | END |
| 302 | ...... | END |
| 303 | ...... | END |
| 304 | 301 | 0001 |
| 305 | 303 | END |
| 306 | 304 | 0002 |

ENBM

| | | |
|---|---|---|
| 0001 | 302 | END |
| 0002 | 305 | END |

FIG. 18

CSM

| | |
|---|---|
| 301 | 0 |
| 302 | 0 |
| 303 | 0 |
| 304 | 3 |
| 305 | 2 |
| 306 | 4 |
| 307 | 2 |

STM (TIME = 0)

| | |
|---|---|
| 301 | H |
| 302 | L |
| 303 | H |
| 304 | L |
| 305 | L |
| 306 | L |
| 307 | L |

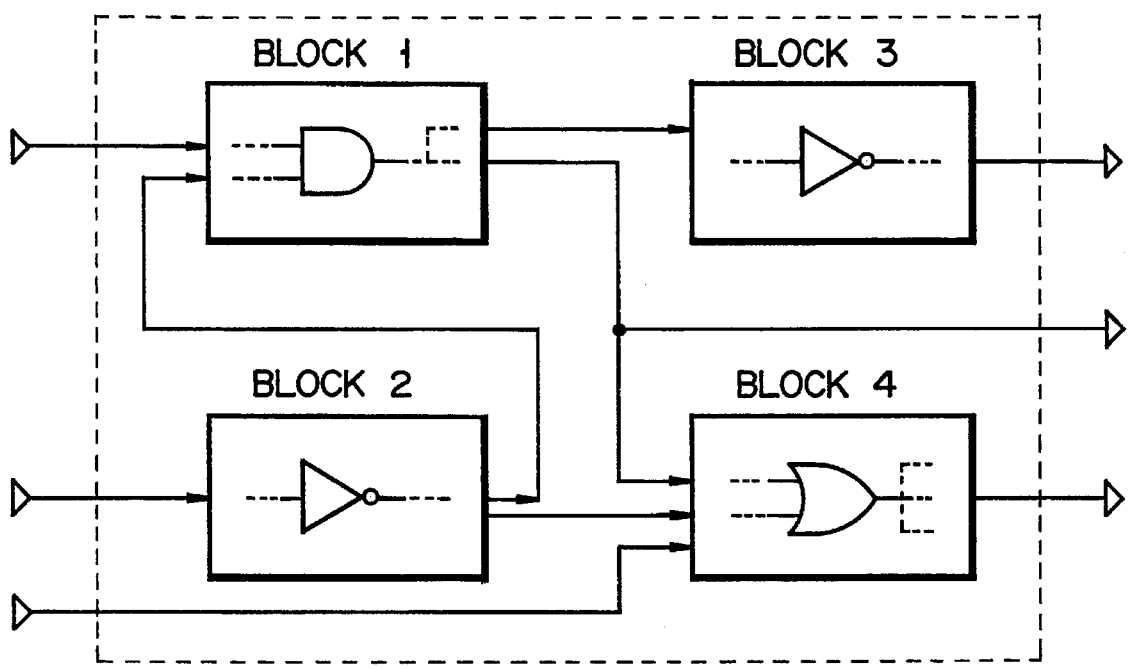
F I G. 22
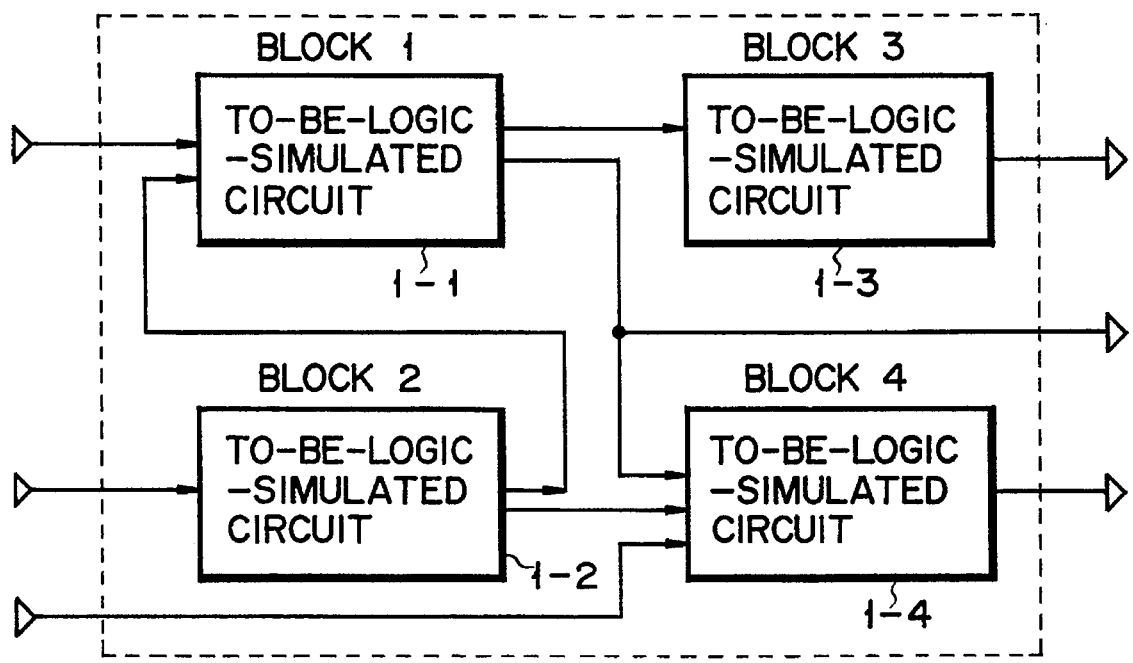
F I G. 23

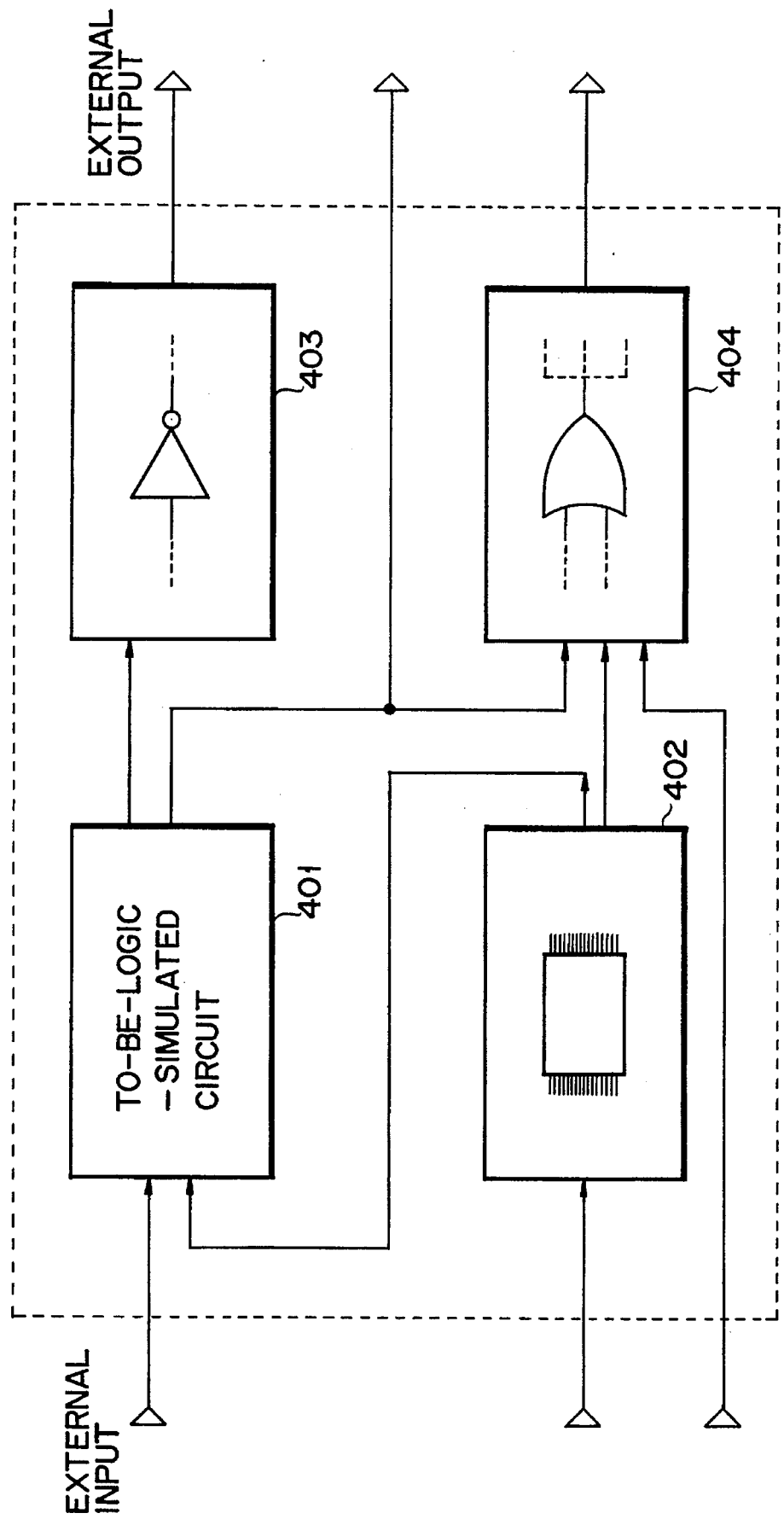
F I G. 24

LOGIC SIMULATOR

This application is a continuation of application Ser. No. 07/639,893, filed on Jan. 11, 1991, now abandoned.

BACKGROUND OF THE INVENTION

1. Field of the Invention

The present invention relates to a logic simulator for performing logic simulation of a semiconductor device.

2. Description of the Related Art

A semiconductor device generally includes a logic circuit constructed by a large number of logic elements. For example, when a new semiconductor device is to be designed, logic elements are logic-simulated by a logic simulator to check whether a designed logic circuit operates as expected. Such a logic simulator is conventionally arranged by software by using a versatile computer or the like.

In order to increase an operation speed in logic simulation performed by a logic simulator, Published Unexamined Japanese Patent Application Nos. 59-3652 or 63-257841 propose a logic simulator in which a portion of software of the logic simulator as described above is replaced by hardware.

In recent years, however, as a packing density of a semiconductor device has been increased, a simulation logic to be simulated by a logic simulator has been large-scale-integrated and complicated. In a conventional logic simulator in which a portion of software is replaced by hardware, therefore, simulation sometimes take several to several tens of hours.

SUMMARY OF THE INVENTION

It is an object of the present invention to provide a logic simulator capable of performing logic simulation at high speed by using hardware.

According to the present invention, there is provided a logic simulator in which data required for performing predetermined logic simulation is externally stored and which executes simulation of a logic element to be simulated or a logic circuit by free running.

According to the present invention, there is provided a logic simulator comprising a time wheel section for causing an external memory unit to store logical object data including data concerning an arrangement of a to-be-simulated logical object and data concerning an input signal to be input to the logical object, an accumulator section for executing simulation concerning the arrangement of the to-be-simulated logical object in accordance with the logical object data read out from the external memory unit, and a function logic section for executing simulation concerning an operation of the to-be-simulated logical object in response to the simulation result obtained by the accumulator section.

According to the present invention, there is provided a logic simulator comprising a time wheel section for managing a time required to execute a simulation to be performed for a to-be-logic-simulated element, a relationship of the nets of the to-be-logic-simulated element and recognizing the type of the to-be-logic-simulated element, and a function logic section for checking a logic operation of the to-be-logic-simulated element and transmitting a delay time of this logic operation to the time wheel section, wherein the time wheel section, the accumulator section, and the function logic section are cyclically connected, and operations of the above sections are repeatedly performed in accordance with an externally input predetermined simulation pattern, thereby executing logic simulation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing a logic simulation apparatus using a logic simulator according to an embodiment of the present invention;

FIG. 7 is a block diagram showing a logic simulation apparatus for logic-simulating the memory cell shown in FIG. 6;

FIG. 8 is a circuit diagram showing a multivalue logics-circuit;

FIG. 9 is an equivalent circuit diagram showing the multivalue logic circuit shown in FIG. 8 to be logic-simulated;

FIGS. 10A and 10B are a block diagram of a time wheel circuit of the logic simulators shown in FIGS. 1 and 7;

FIG. 11 is a circuit diagram showing an accumulator section of the logic simulators shown in FIGS. 1 and 7;

FIG. 12 is a flow chart for explaining procedures of timing error detection performed by the accumulator section;

FIG. 13 is a block diagram showing a function logic section of the logic simulator shown in FIGS. 1 and 7;

FIG. 14 is a circuit diagram showing a practical arrangement of a logic circuit to be logic-simulated by the logic simulator according to the present invention;

FIG. 15 is a timing chart showing signals of respective nets of the logic circuit shown in FIG. 14;

FIG. 17 is a view showing stored contents of a net next stage memory and an extension net next stage memory;

FIG. 18 is a view showing stored contents of a net before stage memory and an extension net before stage memory;

FIG. 19 is a view showing stored contents of a delay table memory;

FIG. 20 is a view showing stored contents of a signal state memory;

FIG. 21 is a circuit diagram showing a logic circuit to be used to determine a failure detection rate of a test pattern;

FIG. 22 is a block diagram showing a large-scale to-be-simulated logic circuit;

FIG. 23 is a block diagram showing a multilogic simulator used to simulate the logic circuit shown in FIG. 22; and FIG. 24 is a block diagram showing a simulation circuit for real chip simulation performed by using the logic simulator according to the present invention.

DETAILED DESCRIPTION OF THE PREFERRED EMBODIMENTS

Figure 2A:
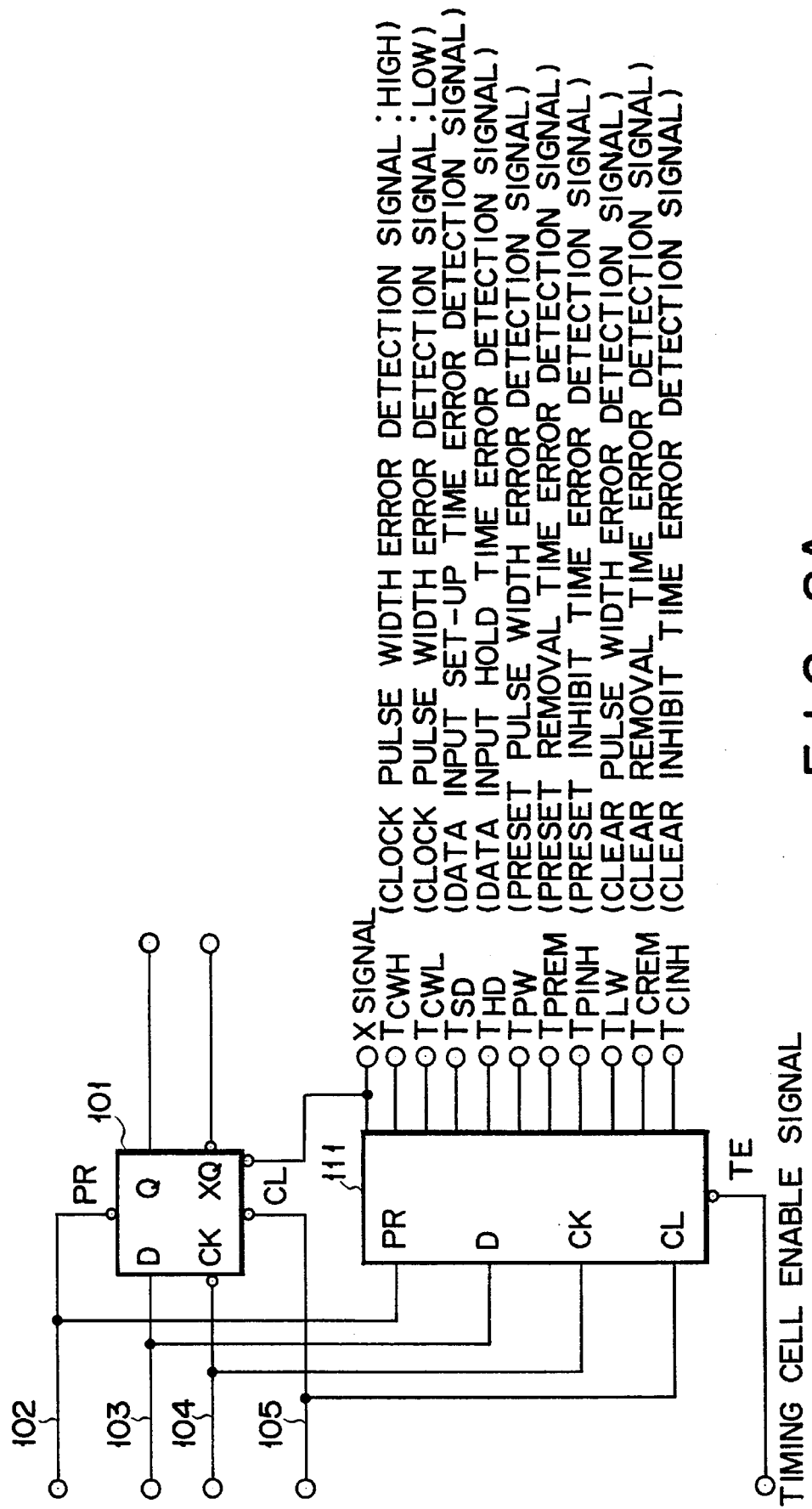
FIG. 2A is a block diagram for explaining processing for a memory cell in timing error detection.

According to a logic simulation apparatus using a logic simulator shown in FIG. 1, a simulation chip (logic simulator) 1 in which a logic simulation circuit is hardware-arranged on a chip, a data storage section 2 constituted by, e.g., a plurality of RAMs, and an engineering work station (to be referred to as an EWS hereinafter) 3 as an I/O device are connected to each other through an external bus 4.

The simulation chip 1 is constituted by a time wheel section (to be referred to as a TWU hereinafter) 11, an accumulator section (to be referred to as an ACU section hereinafter) 12, and a function logic circuit (to be referred to as an FDU section hereinafter) 13. The TWU section 11 has a function of managing a time required to execute various simulation items to be performed for a logic element or logic circuit to be simulated, i.e., a to-be-logic-simulated element or circuit. Note that a time is assigned in correspondence with each simulation item so that the simulation items are sequentially repeatedly performed. The ACU section 12 has functions of monitoring a connection relationship of the nets of the to-be-logic-simulated element and checking a timing error. The FDU section 13 checks a logic operation of a logic gate in accordance with information supplied from the ACU section 12, e.g., data indicating the type of the logic gate and an event (signal level change) generated in an I/O net of the logic gate. In this case, since a delay time is present between generation of an event on an input side and generation of an event on an output side, data concerning the delay time is supplied to the TWU section 11 to determine a timing at which the next logic simulation is to be executed. Since the operations of the TMU section 11, the ACU section 12, and the FDU section 13 are cyclically repeated as described above, logic simulation of a to-be-logic-simulated element or circuit is performed.

In addition, this simulation chip 1 is arranged to select a mode (to be referred to as an A mode hereinafter) in which simulation is performed without detecting a timing error, a mode (to be referred to as a B mode hereinafter) in which simulation is performed while the presence/absence of a timing error is detected and a timing error is displayed if it is generated, and a mode (to be referred to as a C mode hereinafter) in which if a timing error is generated, an output from a cell in which the timing error is detected is set to be an "X" value to execute simulation so that simulation is performed in accordance with the timing error.

The data storage section 2 comprises a condition state memory (to be referred to as a CSM hereinafter) 21, a test vector memory (to be referred to as a TVM hereinafter) 22, a time wheel memory (to be referred to as a TWM hereinafter) 23, an event table memory (to be referred to as an ETM hereinafter) 24, a net information memory (to be referred to as an NIM hereinafter) 25, a result storing memory (to be referred to as an RSM hereinafter) 26, a delay table memory (to be referred to as a DTM hereinafter) 27, and a net signal state memory (to be referred to as an STM hereinafter) 28.

The TWU section 11, the ACU section 12, and the FDU section 13 in the simulation chip 1 are connected to each other through an inner bus (an inner data bus and an inner address bus) 14. In addition, only the STM 28 of a plurality of memories is connected to the ACU section 12 through an exclusive state bus (a state data bus and a state address bus) 30.

Data required for simulation is input from the EWS 3 to the data storage section 2 and fetched in the simulation chip 1 as needed. Of the memories of the data storage section 2, the CSM 21 stores data required to respond to the EWS 3.

Data required for simulation are data concerning an arrangement of a logic, i.e., net information data concerning a connection state of each cell (logic element) and data concerning a specification of each cell, and a test vector concerning an input signal for simulation. These data are written from the EWS 3 into the TVM 22, the NIM 25, and the DTM 27 before simulation is executed. Note that the test vector to be stored in the TVM 22 includes the type of change (to be referred to as an event hereinafter) such as the rising or falling of an input signal and information concerning the name of a net in which the event is generated in the order of generation. An event gate flag indicating the order of generation of an event is assigned to each.

As shown in FIG. 4, the net information data to be stored in the NIM 25 is divisionally stored in a net next stage memory (to be referred to as an NNM hereinafter) 25a and an extension net next stage memory (to be referred to as an ENNM hereinafter) 25b for indicating a cell connected to a net on the output side of a certain cell, and in a net before stage memory (to be referred to as an NBM hereinafter) 25c and an extension net before stage memory (to be referred to as an ENBM hereinafter) 25d for indicating a net connected to the input side of a certain cell. The net information data includes information concerning a cell type (e.g., an AND gate or an OR gate) and information concerning a fan out (load capacitance) of the cell. The DTM 27 stores a set value of a timing error such as a hold time or a set-up time of each cell and a delay time caused by the fan-out.

In the above data concerning the arrangement of a logic, a memory cell such as a flip-flop or a counter is processed as follows in order to detect a timing error such as a set-up time or a hold time.

That is, as shown in FIG. 2, a timing cell 111 for detecting a timing error is connected to nets 102 to 105 on the input side of a memory cell (flip-flop) 101.

Figure 2B:
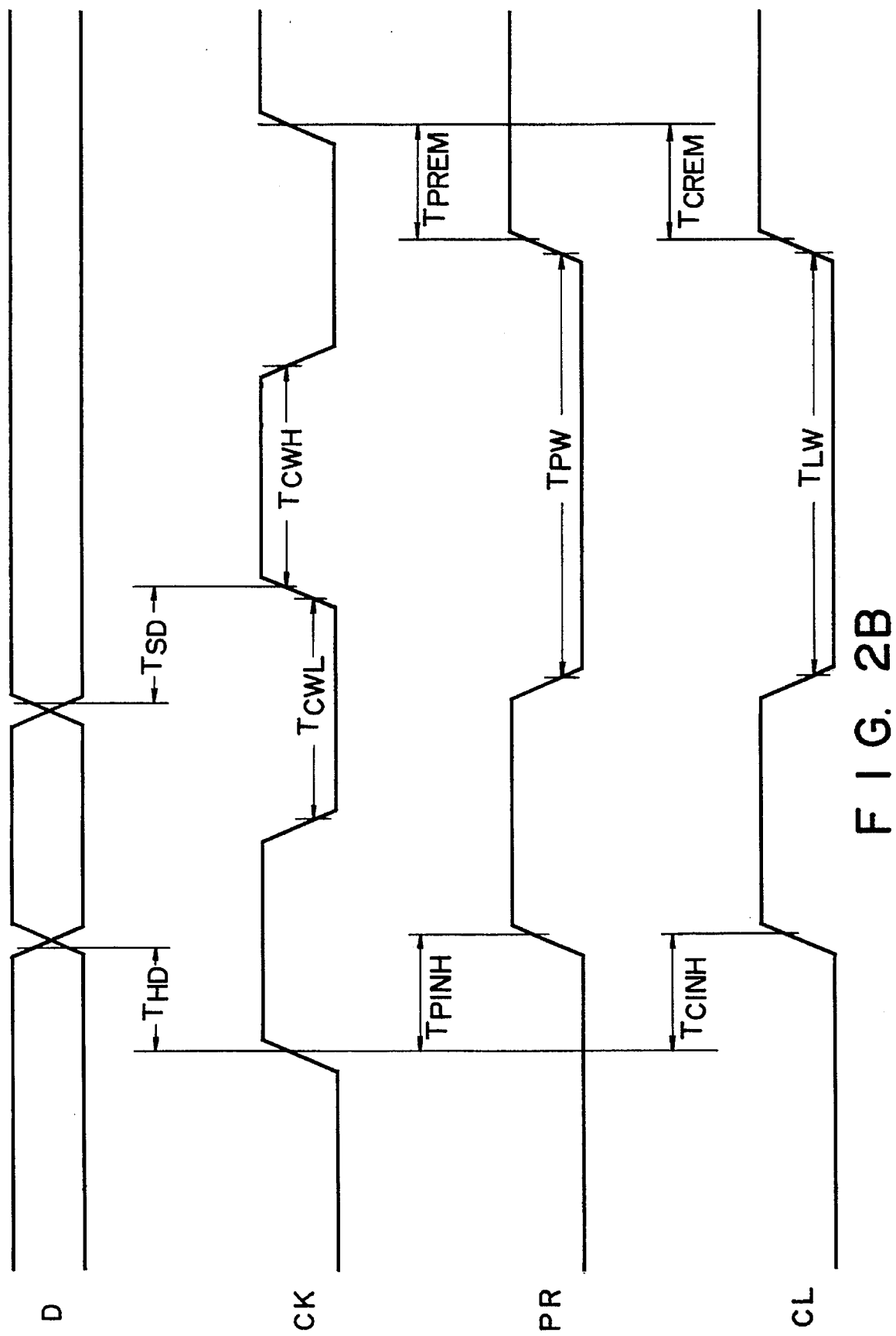
FIG. 2B is a timing chart for explaining the timing error detection.

More specifically, the timing cell 111 is connected to a cell (e.g., a flip-flop or a counter) in which the points in time of events of input signals (e.g., a data signal and a clock signal) are defined and is arranged as a virtual cell for checking if the defined time is maintained. For example, the timing cell 111 connected to the flip-flop 101 having set and reset terminals is assumed to generate ten outputs corresponding to ten types of errors, as shown in FIG. 2A. Net addresses corresponding to these ten outputs are assigned to the DTM 27, and timing error definition times determined by the cell are set at the net addresses of the DTM 27 as delay times. Operations up to this state are performed as preprocessing. For example, when a simulation is executed and the rising edge (event) of a clock signal CK occurs, as shown in FIG. 2B, timing errors which may be generated thereafter are a data hold time (THD) error, a clear inhibit time (TCINH) error, a preset inhibit time (PINH) error, and a clock pulse width (TCWL) error. Therefore, flags are set at net addresses corresponding to these errors, respectively. At this time, when pre-flag reset events for resetting these flags are stored when an event occurs at the data terminal D within the defined time, the hold time error flag is checked to detect a timing error.

The timing cell 111 is operated by a timing cell enable signal. When input timings from the nets 102 to 105 are before a predetermined timing, the timing cell 111 generates timing error detection signals such as clock pulse width error detection signals, a data input set-up time error detection signal, a data input hold time error detection signal, a preset pulse width error detection signal, a preset removal time error detection signal, a preset inhibit time error detection signal, a clear pulse width error detection signal, a clear removal time error detection signal, and a clear inhibit time error detection signal in accordance with each timing error item.

That is, when data concerning the memory cell 101 such as a flip-flop or a counter is input from the EWS 3, the memory cell data is input to the NIM 25 which the timing cell 111 is connected to the memory cell 101, as shown in FIG. 2. In this case, if simulation is to be executed without performing timing error detection (A mode), the timing cell 111 is not operated. If simulation is to be executed while a timing error is displayed or is to be executed in accordance with a timing error (B and C modes), a timing cell enable signal is supplied to the timing cell 111 to operate the cell 111, thereby detecting a timing error.

In the C mode, the "X" signal which neither exhibits high level nor low level upon generation of a timing error is output from the timing cell to the flip-flop 101. When the flip-flop 101 receives the "X" signal, a signal value "X" is set in the Q output of the flip-flop. That is, occurrence of the timing error can be reflected on the simulation of the flip-flop 101.

Figure 3:
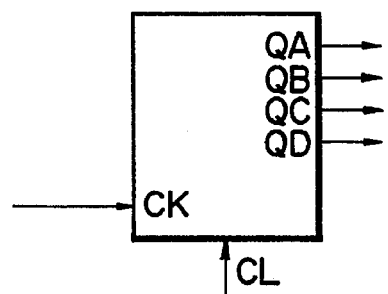
FIG. 3 is view showing a multioutput memory cell.
Figure 4A:
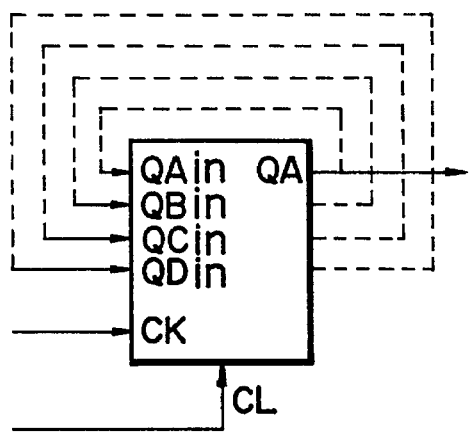
FIGS. 4A to 4D are views showing a plurality of memory cells obtained by dividing the memory cell shown in FIG. 3 in units of outputs.
Figure 4B:
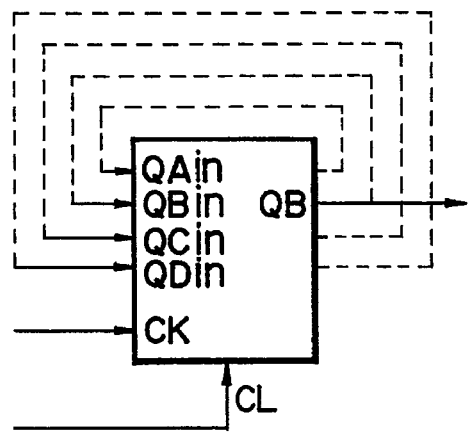
Figure 4C:
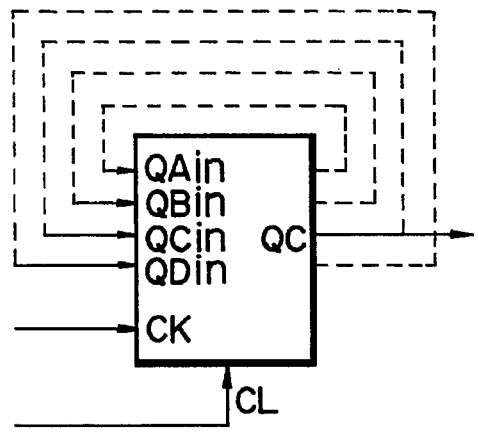
Figure 4D:
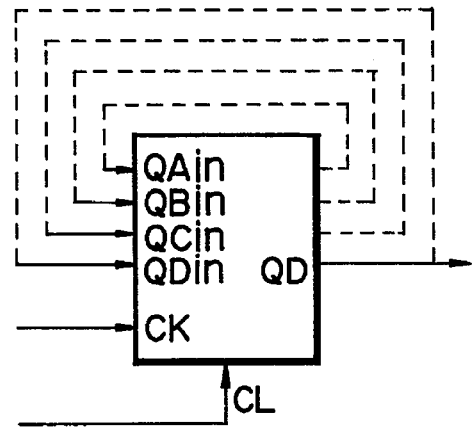

Note that the memory cell 101 and the timing cell 111 are illustrated as a multiinput/multioutput cell in FIG. 2. In an actual operation, however, the memory cell 101 and the timing cell 111 are divided in units of outputs and processed as a plurality of multiinput/one output cells, i.e., processed as a normal gate. More specifically, a multioutput memory cell having a plurality of outputs QA to QD as shown in FIG. 3 is processed as a plurality of one-output cells, in this embodiment, four one-output cells corresponding to the outputs QA, QB, QC, and QD. In addition, a net for performing feedback from an output terminal as needed is provided for each of a plurality of one-output cells. Since the multioutput cell is divisionally processed as described above, when simulation is to be performed for a memory cell by the logic simulator 1, the simulation can be executed in consideration of an output from only one of the divided cells. Therefore, the multioutput memory cell can be processed as a normal cell such as an AND gate or an OR gate. That is, even if a memory cell internally has a complicated gate arrangement, calculation of a delay time or determination of an output logic value can be easily performed.

Figure 5:
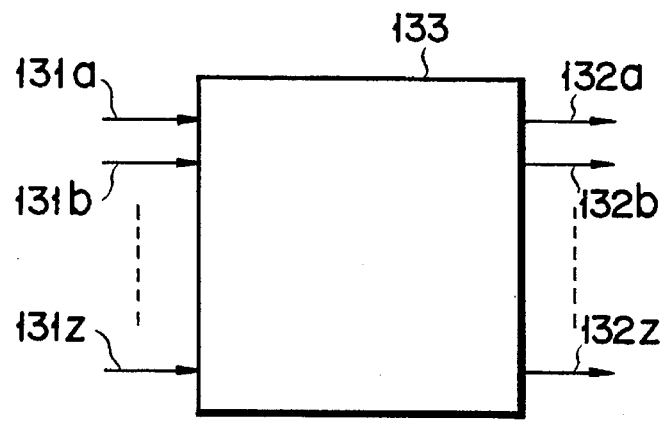
FIG. 5 is a view showing a multiinput-multioutput RAM or ROM.
Figure 6:
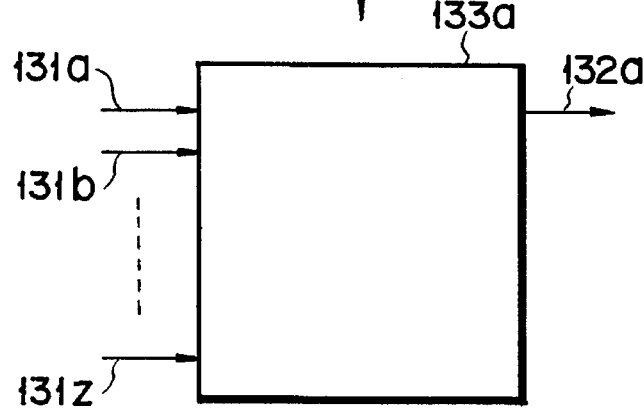
FIG. 6 is a view showing a plurality of memory cells obtained by dividing the RAM or ROM shown in FIG. 5 in units of outputs.
Figure 6:
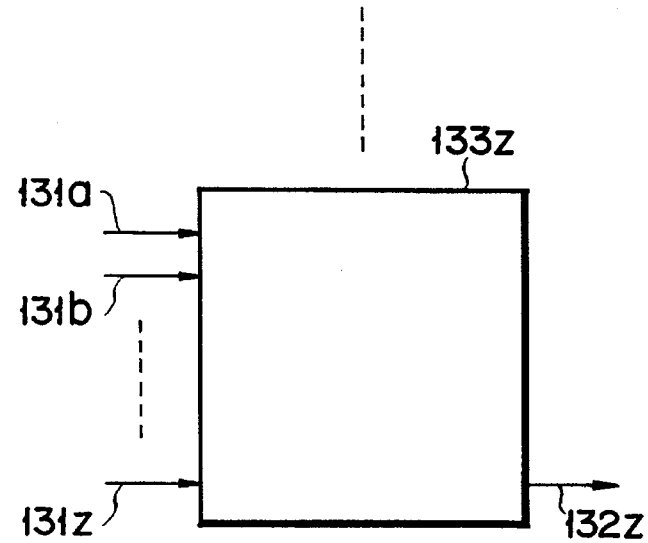

The memories such as a ROM and a RAM can be similarly processed. That is, assuming that a RAM or ROM having a plurality of inputs 131a to 131z and a plurality of outputs 132a to 132z as shown in FIG. 5 is a to-be-logic-simulated cell, this cell is divided in correspondence with the outputs 132a to 132z and processed as a plurality of multi-input/one output cells 133a to 133z. In this manner, since a RAM or ROM is divided into a plurality of one-output cells and processed, the RAM or ROM can be simulated in consideration of only one output. Therefore, the RAM and ROM can be processed as a normal cell such as an AND gate or an OR gate. In this case, real data stored in the RAM or ROM is stored in a RAMCNROM data memory 29 shown in FIG. 7 in accordance with an address of the data. Therefore, the data can be read out and written in as needed by accessing the memory 29.

In order to perform multivalue (e.g., 12 values) simulation for a wire logic circuit or all primitive elements (AND gate, OR gate, etc.), the net information data to be stored in the NIM 25 is processed as follows. That is, if an object to be simulated is a circuit as shown in FIG. 8, i.e., a circuit in which output nets 144 to 146 of three cells 141 to 143 are connected to each other at a node 147 and then connected to a cell 148, this circuit is processed as a circuit in which a cell 149 is provided to determine an output level from the node 147 as one of 12 types of level values in accordance with outputs from the three cells 141 to 143, as shown in FIG. 9. In this manner, if a to-be-logic-simulated multivalue circuit is processed as a circuit in which the cell 149 for determining the output level from the node 147 is arranged, the simulator 1 processes this multivalue circuit as a normal AND gate. As a result, the multivalue circuit is multivalue-simulated as in a normal simulation method.

An arrangement and an operation of the simulation chip hardware-arranged on a single chip, i.e., the logic simulator 1 will be described below in an order of the TWU section 11, the ACU section 12, and the FDU section 13.

Figure 10B:
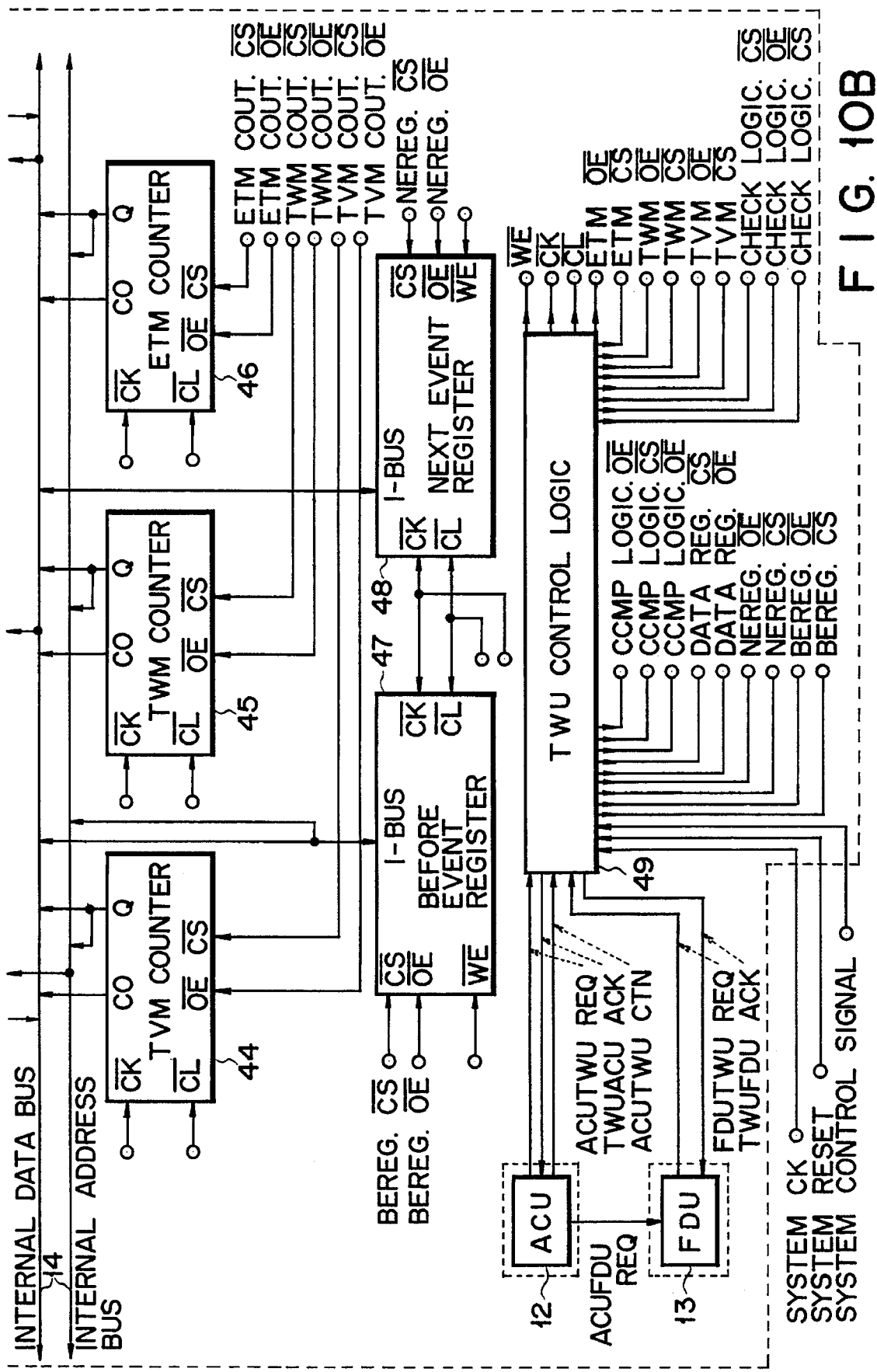

The TWU section 11 is arranged as shown in, e.g., FIGS. 10A and 10B. In this TWU section 11, test vectors written from the EWS 3 into the TVM 22 are sequentially read out and supplied to the TWM 23 and the ETM 24, and newly generated events are written between the test vectors in the order of generation timings.

That is, the TWM 23 stores an address value (pointer) in the ETM 24, which is a memory for managing events having an address as an absolute time and storing data concerning an event such as the name of a net in which an event is generated and an event value of the event, and a generation time (an address of the TWM 23: a pointer) of the next event. The ETM 24 has the name of a net in which an event is generated at a certain time and an event name of the event as data and further has an address value (pointer) of an ETM storing data of another event generated at the same time.

A data bus register 40 of the TWU section 11 is a bidirectional register for connecting inner and outer buses. A comparative logic circuit 41 checks whether events are generated at the same time, and a data check logic circuit 42 checks whether a newly generated event or a loaded event disconnects a pointer (whether a chain of the pointer must be reconnected) or whether a memory write operation is inhibited. An adding logic circuit 43 calculates an absolute time of a newly generated event in accordance with a current absolute time and a delay value.

A TVM counter 44 is a counter for loading test vectors of the TVM 22 into the TWM 23, a TWM counter 45 indicates an absolute time as an address of the TWM 23, and an ETM counter 46 indicates an address of the ETM 24.

A before event register (to be referred to as a BE register hereinafter) 47 indicates current data of the TWM 23. A next event register (to be referred to as NE register hereinafter) 48 stores data loaded from the TVM 22 or newly generated event data.

A TWU control logic circuit 49 controls an operation of the TWU section 11.

The operation of the TWU section 11 will be described.

The TWU section 11 loads a test vector for performing a simulation item stored in the TVM 22 to the TWM 23. (Note that loading is performed only within a time range indicated by the TWM 23.)

In the above operation, if events which are generated at the same time are present, the TWU section 11 writes the names of nets in which the events are generated and event values of the events in the ETM 24, and an address of the ETM 24 is written in the TWM 23 as a pointer of the TWM 23. Note that this operation is performed by using the BE register 47 and the NE register 48. If a pointer indicating the next event generation time which is stored in the TWM 23 must be updated (a chain of the pointer must be reconnected) since a loaded event exceeds a previously loaded event, the pointer is updated.

when loading of the test vectors from the TVM 22 into the TWM 23 is finished as described above, the TWM 23 sequentially reads out events to the ACU section 12 in response to an event read request signal (ACU request) from the ACU section 12.

When data is supplied from the data storage section 2 to the ACU section 12, the right of use of the external bus 4 is transferred to the ACU section 12, and the TWU section 11 waits until a newly generated event write request signal is supplied from the FDU section 13 or an ACU request is supplied from the ACU section 12.

When the ACU request is supplied, events are sequentially read out from the TWM 23 to the ACU section 12 again.

When the event write request signal is generated by the FDU section 13, the name of a net in which a new event is generated, an event value of the event, and a delay value are supplied to the internal data bus 14. The TWU section 11 latches this data by the data bus register 40, calculates an absolute time of the newly generated event from a current absolute time and the delay value by the adding logic circuit 43, and writes the calculated absolute value into the TWM 23. In this case, if a pointer indicating the next event generation time of the TWM 23 must be updated (a chain of the pointer must be reconnected), the pointer is updated.

Thereafter, if an event is still present in the TWM 23, the event is read out from the TWM 23 to the ACU section 12, and the processing is similarly performed as described above. If no event is present in the TWM 23, test vectors in the next time range are loaded from the TVM 22 to the TWM 23, and the above processing is repeated. When all of the test vectors for performing simulation items stored in the TVM 22 are loaded and processed and all of the generated events are processed accordingly, the operation is ended.

In the embodiment shown in FIG. 10A, an SRAM is used as each memory. If, however, a DRAM is used as the memory, a DRAM controller must be additionally used.

The ACU section 12 will be described below with reference to FIG. 11.

In the ACU section 12, an ACU control logic circuit 60 outputs an ACU request. When a TW acknowledge signal is supplied from the TWU section 11, event data output from the internal bus 14 is latched by an IBUS register 61 in synchronism with the TW acknowledge signal. When the ACU section 12 receives the TW acknowledge signal, it obtains the right of use of the external bus 4. Therefore, the ACU section 12 latches the event data and an event read request signal at "L", thereby starting its internal operation. The STM 28 is accessed by the name (address) of a net in which the event latched by the IBUS register 61 is generated, and a current state (logic value) of the net in which the event is generated and an event gate flag are stored in a status register 62.

Thereafter, the event gate flag stored in the IBUS register 61 and indicating the event (current event) from the TWU section 11 and the event gate flag supplied from the STM 28 and stored in the status register 62 are compared by an ALU circuit 63, thereby checking whether the current event is a valid event or an invalid event or must be replaced by a logic value "X" as an indeterminate event.

More specifically, when a certain input event is input to a cell, for example, an output event is output with a certain delay time in accordance with rising and falling characteristics and the like of the cell. If, however, another input event is present within the delay time from the input time to the output time, the output is set in an "X" state (undefined state). In addition, a phenomenon called "passing" in which an order of an output event and an order of an input event are reversed may occur in accordance with a relationship between rising and falling delay times of a cell, and such a timing error is detected as follows. Note that the event gate flag includes an event gate in flag and an event gate out flag. When an event is present at the input of a cell and a feature event is generated at the output thereof, the event gate in flag indicates an input order incremented when the feature event is written in the TWM 23. The event gate out flag indicates a feature event extracted from the TWM 23.

As shown in FIG. 12, an arithmetic operation of (contents of IBUS register 61)—(contents of status register 62) is performed for the event gate flag, and whether the obtained value is zero is checked (201). If the value is zero, events propagating inside the cell are only a current event or a current event is generated by the latest input of the events propagating inside the cell. If the value is zero, therefore, IBUS≠0 (202) is checked for an event signal. If the current event changes an old signal value of the net, this event is processed as a valid event (203). If the current event does not change the old signal value of the net, this event is canceled and determined to be not present (204).

If the value obtained by the arithmetic operation step 201 is not zero, another event propagating inside the cell is present. That is, for example, after the current event is written in the TWM 23 as a feature event, another event may have been generated at the input of the cell before the current event is read out after a delay time. If the arithmetic value is not zero in step 201, therefore, an arithmetic operation of (contents of IBUS register 61)—(contents of status register 62) is performed for the event out flag, and whether the obtained value is larger than zero (one or more) is checked (205).

If the above value is zero or less, it is determined that the current event is passed by another event propagating through the cell, and the current event is unconditionally canceled (204). If the value is larger than zero (one or more), the current event is not passed by another event during propagation inside the cell and has a logic value "X". If the value is one or more, therefore, IBUS≠0 is checked for the event signal (206).

If the current event changes an old signal value of the net, the logic value is set to be "X" (207), and the current event is processed as a valid event (203). If the current event does not change an old signal value of the net, this event is canceled and determined to be not present (204).

If the current event is determined to be invalid by the determination results as described above, the event gate flag of the IBUS register 61 is written in the STM 28 to prepare for calculation of the next event data from the TWU section 11, thereby finishing the processing of the current event.

If the current event is determined to be valid in the above determination, the processing is continuously performed as follows.

That is, the current event of the IBUS register 61 and the event flag data are written in the STM 28, and the contents of the current event are stored in the RSM 26 via a data selector 64.

At this time, an address in which the current event is to be written is sequentially incremented from, for example, "0000" to "FFFF" by an RSM write address counter 65.

Note that the result of simulation is temporarily written in the TWM 23 or ETM 24 and read out from the memory after a delay time. The simulation result is not written in the RSM 26 as a past event until the event flag data is checked. The ACU section 12 starts an operation of obtaining an output change (next stage event) of a next stage cell generated by the current event.

First, the NNM 25a in the NIM 25 is accessed by the name (address) of a net which is latched by the IBUS register 61 and in which an event is generated, and the name (address) of a net in which the next stage event may be generated, the type of cell, and fan out are stored in an NN register 66. If two or more nets in which a next stage event may be generated are present, only pointers for connecting next stage net addresses are read out for the second and subsequent nets. After the first next stage net is processed, the second and subsequent next stage nets are sequentially read out and processed in accordance with the pointers.

The NBM 25c in the NIM 25 is accessed by the address of the next stage net stored in the NN register 66, and an address of an input net having an influence on the next stage net and its input pin code (e.g., clock, clear, data enable, or load) is stored in an NB register 67. If two or more addresses are present in the input net, the next stage nets are read out in units of inputs by using pointers similar to the next stage nets. In addition, the STM 28 is accessed in accordance with the address of the next stage net stored in the NN register 66 by parallel processing, and a current state (logic value) of the next stage net and the event gate flag are stored in the status register 62.

Thereafter, the STM 28 is accessed in accordance with the address of the input net stored in the NB register 67, and a current state (logic value) of the input net is stored in the status register 62. The ENBM 25d is accessed in accordance with the pointer for connecting the address of the input net stored in the NB register 67, and an address of another input net is stored in the NB register 67. Information concerning the next stage net, the input net, the pin code, the cell type, the fan out, and the like stored in the status register 62, the NN register 66, and the NB register 67 is transferred from a data selector 68 to an input register of the FDU section 13 via the internal bus 14 each time the status register 62 is rewritten.

when all the information are transferred to the FDU section 13, the ACU control logic 60 outputs an ACU continue or ACU request to give the right of use of the external bus 4 to the FDU section 13.

That is, if a plurality of next stage nets are present, the ACU section 12 outputs an ACU continue signal and waits until the processing in the FDU section 13 and the TWU section 11 is finished. If TW acknowledge is present, the above processing is repeated for the next stage net. If no next stage net is present, the internal NN register 66, NB register 67, and status register 62 are all cleared, and the next current event is output from the TWU section 11 onto the internal bus 14. The ACU control logic 60 outputs an ACU request, and the ACU section 12 waits until TW acknowledge is output.

The FDU section 13 will be described below with reference to FIG. 13.

First, the FDU section 13 latches the data transferred from the ACU section 12 as described above. In each logic block, an output logic value is determined in accordance with an input logic value, and an output logic value of a designated cell is selected from cell type data.

The FDU section 13 compares the selected output logic value with a current output logic value and checks generation of an event (presence/absence of a signal level change). If an output is determined by input data other than an event pin (in which an event is generated), the FDU section 13 determines that no event is generated. If no event is generated, the FDU section 13 supplies a signal indicating that no event is generated to the internal bus 14, and the processing of the FDU section 13 is finished. If an event is generated, the FDU section 13 checks a rising/falling change of the event in accordance with the current output logic value and the selected output logic value and forms an address of the DTM 27 in accordance with a cell type, an input pin name, and an output pin name. In addition, the FDU section 13 supplies a delay time or a set value of a timing error which is input from the DTM 27, the net address, the presence/absence of an event, and the logic value to the internal bus 14, thereby finishing the processing of the FDU section 13. The logic simulation of the present invention will be described below on the basis of a to-be-simulated logic circuit shown in detail in FIG. 14.

According to the logic circuit shown in FIG. 14, nets 301 and 302 are connected to the inputs of an AND gate G1, and a net 303 is connected to the input of an inverter G2. A net 304 is connected to the output of the AND gate G1, the input of an inverter G4, and the first input of an OR gate G3. A net 305 is connected to the output of the inverter G2 and the second input of the OR gate G3, and a net 306 is connected to the output Of the OR gate G3. A net 307 is connected to the output of the inverter G4. Signals as shown in FIG. 15 appear in these nets 301 to 307. Referring to FIG. 15, reference numerals (1) to (10) represent event gate flags.

Figure 16:
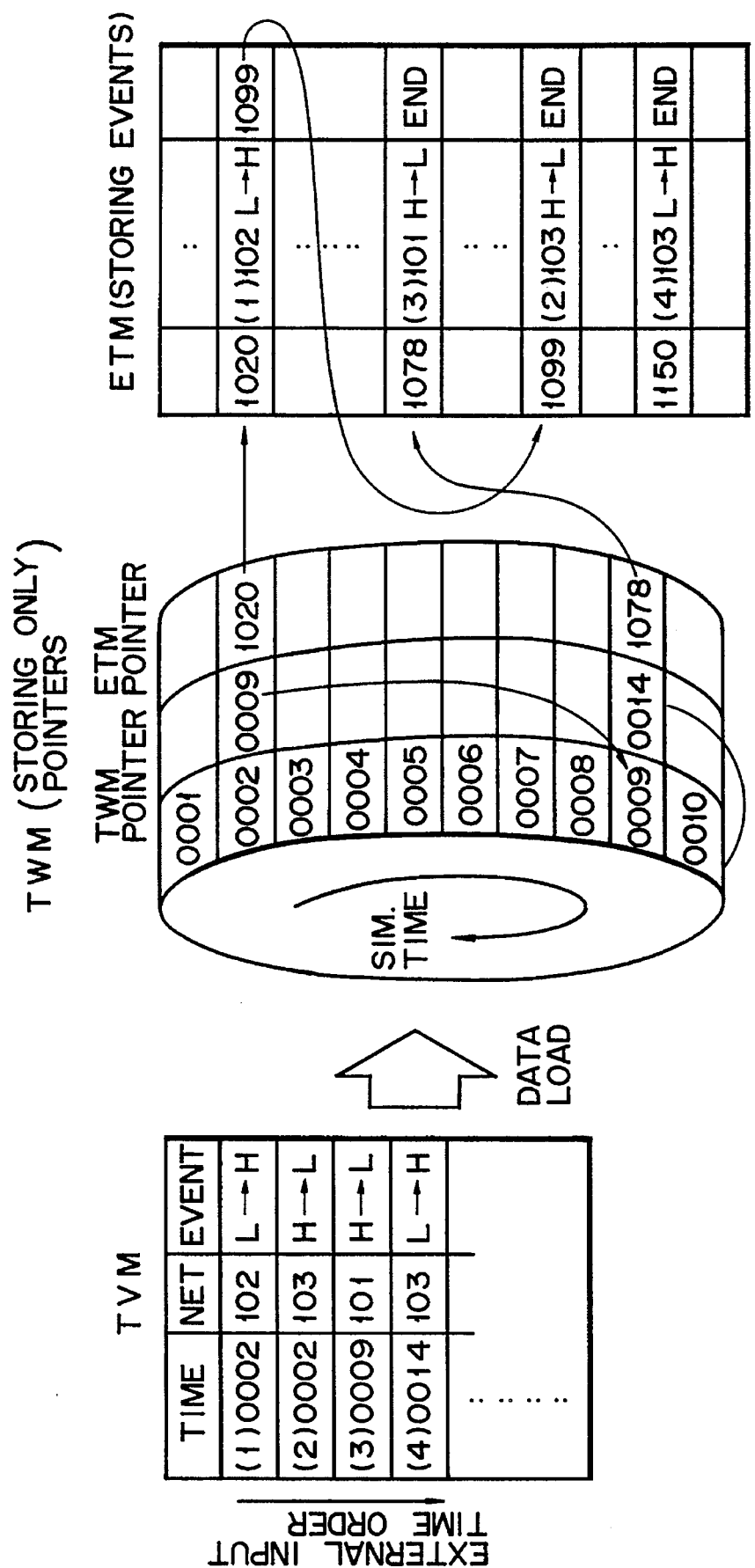
FIG. 16 is a view showing stored contents of various types of memories for storing information of the logic circuit and signals shown in FIGS. 14 and 15.

Test vector data, net information data, delay time data and timing error set value data shown in FIGS. 14 and 15 are written from the EWS 3 into the TVM 22, the NIM 25, and the DTM 27. As shown in FIG. 16, the test vector to be stored in the TVM 22 includes data concerning a time, a net name, and an event type. This test vector data is transferred to and stored in the TWM 23 and ETM 24. For example, time 0002, net names 102 and 103 in which events are generated at the time 0002, and events L Cj H and H Cj L are stored in the TVM 22. Similarly, time 0009, net name 101 in which an event is generated at the time 0009, and event H Cj L are stored in the TVM 22. The TWM 23 stores addresses corresponding to times, e.g., 0001, 0002, . . . , addresses corresponding to next event generation times, e.g., 0009, 0014 . . . . , and addresses (pointers) of the ETM 24, e.g., 1020, 1078, . . . The ETM 24 is accessed by the address stored in the TWM 23 and stores address 1099 which stores the event generation net name 302, the type of the event, i.e., the event L Cj H, and another event L Cj H generated at the same time.

The net information data to be stored in the NIM 25 is stored in the NNM 25a, the ENNM 25b, the NBM 25c, and the ENBM 25d as shown in FIGS. 17 and 18. That is, data stored in the NNM 25a indicates that the name of the cell connected to the net 301, i.e., the net connected to the output of the AND gate, i.e., the name of the net in the rear stage of the net 301 is 304. The inverter G4 and the OR gate G3 are connected to the output of the net 304. In this case, the net name 306 connected to the output of the OR gate G3 and the address 0001 of the ENNM 25b are stored. This address 0001 of the ENNM 25b stores the net name 307 connected to the output of another cell, i.e., the inverter G4. The NBM 25c and the ENBM 25d store data indicating that net names connected to the input of the cell connected to the net 304, i.e., the AND gate G1, i.e., net names in the before stage of the net 304 are 301 and 302. FIG. 19 shows delay time of each net to be stored in the DTM 27. For example, FIG. 19 indicates that the net 304 has delay information 4 obtained by the AND gate G1 having a delay amount=4. FIG. 20 shows initial data levels of the respective nets as shown in the timing charts of FIG. 15.

When the data as show in FIGS. 16 to 20 is input from the EWS 3 to the data storage section 2 and transferred to the simulation chip 1, the TWU section 11, the ACU section 12, and the FDU section 13 operate as described above to execute simulation of the operation of the logic circuit shown in FIG. 14 at a high speed.

A simulation chip for fixing a logic value of at least one of the nets constituting a logic circuit to enable simulation of a failure occurrence state will be described below.

For example, as shown in FIG. 21, one of the logic values of nets 161 to 167 connected to cells 151 to 153 is fixed, i.e., fixed to 1 or 0 regardless of an output logic value, simulation is performed in a failure occurrence state in accordance with a predetermined test pattern, and whether a failure can be detected by this test pattern is checked. If the simulation result is adversely affected by fixing of the logic value, it is determined that a failure can be detected by the test pattern. If the simulation result is not adversely affected by fixing of the logic value, it is determined that failure detection is impossible. A net for fixing the logic value is sequentially changed among the nets 161 to 167, and simulation is repeatedly performed for each net. As a result, a failure detection rate by the pattern is determined. In order to determine the failure detection rate, when a read operation of a net logic value from the STM 28 is to be performed as the processing of the ACU section 12, a fixed logic value (1 or 0) is stored in the status register 62 for a net having a logic value to be fixed regardless of a logic value read out from the STM 28, and this fixed logic value is transferred to an input register of the FDU section 13. This simulation, therefore, is simulation to be performed when a net having a fixed logic value is connected to a power source or ground.

In the above embodiment, various information of a to-be-simulated logic circuit is transferred from the EWS 3 to the data storage section 2, and the data of the section 2 is supplied to the logic simulator 1 to execute logic simulation. If, however, logic simulation is to be performed for a large-scale integrated circuit exceeding the capacity of the logic simulator 1, e.g., a circuit as shown in FIG. 23, a multilogic simulator as shown in FIG. 23 is used. That is, as shown in FIG. 23, four logic simulators 1—1 to 1-4 are assigned to logic circuit blocks 1 to 4 shown in FIG. 22 and logic-simulate the blocks 1 to 4, respectively.

In addition, in order to perform system development (mounting substrate design) or LSI design, the development or design can be sometimes performed more efficiently by using the entire system. In this case, simulation is performed by using a real IC chip or LSI chip. This simulation is called real chip simulation. In order to execute high-speed logic simulation by using a real chip simulator for the real chip simulation, a logic circuit expressed by software must be logic-simulated at a high speed. The real chip simulator, however, depends on a time of a simulation operation performed by the software portion. In the present invention, therefore, logic simulation performed by the software portion of the real chip simulator is performed by the hardware simulator of the present invention to realize high-speed real chip simulation. That is, when a logic device constituted by four logic blocks 401 to 404 each having a plurality of real logic chips as shown in FIG. 24 is to be real-simulated, the hardware logic simulator of the present invention is used as the logic block 401 and connected to the other three real logic blocks 402 to 404. In this case, memory cell data transferred from an external device or other real logic chips 402 to 404 is stored in a hardware logic simulator 401. The output data from the logic simulator can be input as input data to the other logic simulator or the real chip or chips.

As has been described above, according to the present invention, since the above processing of the TWU section 11, the ACU section 12, and the FDU section 13 is repeatedly performed, the logic simulator 1 can execute high-speed simulation for a change over time of a to-be-simulated logic element in accordance with test vectors in the TVM 22 without exchanging data with respect to the EWS 3 during simulation.

That is, in logic simulation of this embodiment, all the logic portions except for the memories are arranged as hardware on a single chip, and this hardware can solely execute simulation. In the present invention, therefore, unlike in conventional logic simulation, a hardware portion, i.e., a simulation chip need not exchange data with respect to a software portion, i.e., a work station during simulation. As a result, since a time required for data exchange can be reduced, the speed of simulation is largely increased as compared with conventional simulation.

In addition, in the ACU section 12, the ALU section 63 compares the event gate flag stored in the IBUS register 61 and indicating an event (current event) from the TWU section 11 with the event gate flag supplied from the STM 28 and stored in the status gate flag register 62, thereby detecting a timing error. Therefore, even simulation in which a timing error is taken into consideration can be executed at a high speed as compared with conventional simulation.

Furthermore, one of the logic values of nets can be fixed to perform simulation in a failure state in which the net having the fixed logic value is assumed to be connected to a power source or ground. Therefore, by sequentially changing the net having a fixed logic value to repeatedly perform simulation for all the nets, determination of a failure detection rate of a test pattern or the like can be performed within a short time. When the simulation results are sequentially compared with an expected value, if a simulation result different from the expected value is obtained and it is determined that failure detection is possible, simulation (failure simulation) for the corresponding net may be immediately performed. As a result, the test pattern failure detection rate can be determined within a shorter time.

When the A mode is selected as the simulation mode, no timing error detection as described above is performed. That is, the logic simulator of this embodiment can select the A mode in which simulation is performed without detecting a timing error, the B mode in which simulation is executed while the presence/absence of a timing error is detected and if a timing error is detected, the detected timing error is displayed, and the C mode in which if a timing error is generated, simulation is executed while an output from a cell in which the timing error is detected is set to be a value obtained by generation of the timing error so that the simulation is performed in consideration of the timing error. By selecting the C mode, therefore, simulation can be performed in a state closer to a real state as compared with conventional simulation. In addition, since all the logic portions except for the memories are formed as hardware on a single chip and this hardware can solely perform simulation, simulation can be performed at a high speed and within a short time as compared with conventional simulation.

A multioutput memory cell is divisionally processed in accordance with the number of outputs, and simulation can be executed in consideration of an output from only one of the divided cells. Therefore, the multioutput memory cell can be processed as a normal cell such as an AND gate or an OR gate. Real data stored in a memory cell such as a RAM or ROM is stored in an exclusive memory in accordance with its address, and a data read/write operation can be performed by accessing this memory as needed. Therefore, even when a logic circuit having a memory such as a ROM or RAM is to be simulated, a hardware portion and a software portion need not exchange data with each other. As a result, a time required for data exchange can be reduced to realize high-speed simulation.

Note that in the above embodiment, the hardware logic simulator having the TWU section 11, the ACU section 12, and the FDU section 13 on a single chip has been described. The present invention, however, can be similarly applied to hardware logic simulators divided on a plurality of (e.g., two or three) chips.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A logic simulator connected to a data storage section and a work station for transferring data required for logic simulation to said storage section, said logic simulator comprising:

a time wheel circuit for managing a time required for executing various simulation items of the logical simulation and causing a memory unit included in said data storage section to store, every predetermined time period, logical object data including data concerning an arrangement of a to-be-simulated logical object and data concerning an input signal to be input to said logical object;

an accumulator circuit connected to said time wheel circuit for executing simulation concerning the arrangement of said to-be-simulated logical object in accordance with the logical object data read out from said memory unit, said accumulator circuit including a check circuit having at least one data input to which a data input signal is applied, a clock input to which a clock signal is applied, and an output, said check circuit comparing said data input signal with a predetermined data value at a timing determined by said clock input signal and producing at said output of said check circuit a timing error detection signal based on the comparison, and a memory cell having said data input signal applied to one input thereof, and the output signal of said check circuit applied from the output of said check circuit to another input of said memory cell, said memory cell having an output outputting said data input signal when said timing error detection signal indicates that no timing error has occurred, and outputting a signal which exhibits neither a high level nor a low level when the timing error detection signal indicates a timing error has occurred;

a function logic circuit connected to said time wheel circuit and said accumulator circuit for executing simulation concerning an operation of said to-be-simulated logical object in accordance with simulation result data obtained by said accumulator circuit and the output signal output by said memory cell so that said output signal is immediately propagated in said logic simulation; and means for executing said logic simulation using said time wheel circuit, said accumulator circuit and said function logic circuit by operating without being controlled by said work station after a transferring of data from said work station to said data storage section.

2. A logic simulator according to claim 1, wherein said accumulator circuit receives the logical object data including connection data of said logical object, test vector data concerning an input signal, and data concerning a specification of said logical object from said memory unit to execute simulation concerning the arrangement of said logical object and outputs a simulation result to said function logic circuit.

3. A logic simulator according to claim 1, wherein said time wheel circuit, said accumulator circuit, and said function logic circuit are integrally formed on a single chip.

4. A logic simulator connected to a data storage section and a work station for transferring data required for logic simulation to said data storage section, said logic simulator being constituted by a plurality of sublogic simulators for performing logic simulation for a plurality of logical objects, each of said sublogic simulators comprising:

a time wheel circuit for managing a time required for executing various simulation items of the logical simulation and causing a memory unit included in said data storage section to store, every predetermined time period, logical object data including data concerning an arrangement of a to-be-simulated logical object and data concerning an input signal to be input to said logical object;

an accumulator circuit connected to said time wheel circuit for executing simulation concerning the arrangement of said to-be-simulated logical object in accordance with the logical object data read out from said memory unit, said accumulator circuit including a check circuit having at least one data input to which a data input signal is applied, a clock input to which a clock signal is applied, and an output, said check circuit comparing said data input signal with a predetermined data value at a timing determined by said clock input signal and producing at said output of said check circuit a timing error detection signal based on the comparison, and a memory cell having said data input signal applied to one input thereof, and the output signal of said check circuit applied from the output of said check circuit to another input of said memory cell, said memory cell having an output outputting said data input signal when said timing error detection signal indicates that no timing error has occurred and outputting a signal which exhibits neither a high level nor a low level when the timing error detection signal indicates a timing error has occurred;

a function logic circuit connected to said time wheel circuit and said accumulator circuit for executing simulation concerning an operation of said to-be-simulated logical object in accordance with simulation result data obtained by said accumulator circuit and the output signal output by said memory cell so that said output signal is immediately propagated in said logic simulation; and means for executing said logic simulation by means of said time wheel circuit, said accumulator circuit and said function logic circuit, wherein said means for executing operates without being controlled by said work station after a transferring of data from said work station to said data storage section.

5. A logic simulator connected to a data storage section and a work station for transferring data required for logic simulation to said data storage section, said logic simulator being provided in a logic device including a plurality of real logical objects in order to execute logic simulation, said logic simulator comprising:

a time wheel circuit for managing a time required for executing various simulation items of the logical simulation and causing a memory unit included in said data storage section to store, every predetermined time period, logical object data including data concerning an arrangement of a to-be-simulated logical object and data concerning an input signal to be input to said logical object;

an accumulator circuit connected to said time wheel circuit for executing simulation concerning the arrangement of said to-be-simulated logical object in accordance with the logical object data read out from said memory unit, said accumulator circuit including a check circuit having at least one data input to which a data input signal is applied, a clock input to which a clock signal is applied, and an output, said check circuit comparing said data input signal with a predetermined data value at a timing determined by said clock input signal and producing at said output of said check circuit a timing error detection signal based on the comparison, and a memory cell having said data input signal applied to one input thereof, and the output signal of said check circuit applied from the output of said check circuit to another input of said memory cell, said memory cell having an output outputting said data input signal when said timing error detection signal indicates that no timing error has occurred and outputting a signal which exhibits neither a high level nor a low level when the timing error detection signal indicates a timing error has occurred;

a function logic circuit connected to said time wheel circuit and said accumulator circuit for executing simulation concerning an operation of said to-be-simulated logical object in accordance with simulation result data obtained by said accumulator circuit and the output signal output by said memory cell so that said output signal is immediately propagated in said logic simulation; and means for executing said logic simulation using said time wheel circuit, said accumulator circuit and said function logic circuit, wherein said means for executing operates without being controlled by said work station after a transferring of data from said work station to said data storage section.

6. A logic simulator connected to a data storage section and a work station for transferring data required for logic simulation to said data storage section, said logic simulator comprising:

a time wheel circuit for managing a time required for executing logic simulation for a to-be-simulated logical object having a plurality of nets;

an accumulator circuit connected to said time wheel circuit for checking a connection relationship between the nets of said to-be-simulated logical object to recognize an arrangement of said to-be-simulated logical object, said accumulator circuit including a check circuit having at least one data input to which a data input signal is applied, a clock input to which a clock signal is applied, and an output, said check circuit comparing said data input signal with a predetermined data value at a timing determined by said clock input signal and producing at said output of said check circuit a timing error detection signal based on the comparison, and a memory cell having said data input signal applied to one input thereof, and the output signal of said check circuit applied from the output of said check circuit to another input of said memory cell, said memory cell having an output outputting said data input signal when said timing error detection signal indicates that no timing error has occurred, and outputting a signal which exhibits neither a high level nor a low level when the timing error detection signal indicates a timing error has occurred;

a function logic circuit connected to said time wheel circuit and said accumulator circuit for receiving the recognition result from said accumulator circuit to check an operation of said to-be-simulated logical object and transmitting data concerning a time of the operation to said time wheel circuit, wherein said time wheel circuit, said accumulator circuit and said function logic circuit are cyclically connected, receive externally input predetermined simulation pattern data, and repeatedly perform operations of said circuits in accordance with the simulation pattern data; and means for executing said logic simulation using said time wheel circuit, said accumulator circuit and said function logic circuit, wherein said means for executing operates without being controlled by said work station after a transferring of data from said work station to said data storage section.

7. A logic simulation apparatus comprising:

a memory unit for storing logical object data including data concerning an arrangement of a to-be-simulated logical object and data concerning an input signal to be input to said logical object; and a logic simulator, connected to said memory unit, for executing logical simulation by free running in response to said memory unit, wherein said logic simulator comprises:
a time wheel circuit for controlling a read timing of the logical object data from said memory unit;
an accumulator circuit connected to said time wheel circuit for executing a simulation concerning an arrangement of said to-be-simulated logical object in accordance with the logical object data read out from said memory unit, said accumulator circuit including a check circuit having at least one data input to which a data input signal is applied, a clock input to which a clock signal is applied, and an output, said check circuit comparing said data input signal with a predetermined data value at a timing determined by said clock input signal and producing at said output of said check circuit a timing error detection signal based on the comparison, and a memory cell having said data input signal applied to one input thereof, and the output signal of said check circuit applied from the output of said check circuit to another input of said memory cell, said memory cell having an output outputting said data input signal when said timing error detection signal indicates that no timing error has occurred and outputting a signal which exhibits neither a high level nor a low level when the timing error detection signal indicates a timing error has occurred;

a function logic circuit connecting to said time wheel circuit and said accumulator circuit for executing simulation concerning the operation of said to-be-simulated logical object in response to the simulation result obtained by said time accumulator circuit; and means for executing said logic simulation without being controlled by said work station.

* * * * *